(12) United States Patent
Kim et al.

(10) Patent No.: US 10,546,844 B2
(45) Date of Patent: Jan. 28, 2020

(54) STACK PACKAGE AND METHOD OF MANUFACTURING THE STACK PACKAGE

(71) Applicant: Samsung Electronics Co., Ltd., Suwon-si (KR)

(72) Inventors: Jae-Choon Kim, Yongin-si (KR); Eon-Soo Jang, Yongin-si (KR); Eun-Hee Jung, Yongin-si (KR); Hyon-Chol Kim, Yongin-si (KR); Byeong-Yeon Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 246 days.

(21) Appl. No.: 15/342,689

(22) Filed: Nov. 3, 2016

(65) Prior Publication Data

US 2017/0154878 A1 Jun. 1, 2017

(30) Foreign Application Priority Data

Nov. 26, 2015 (KR) .......................... 10-2015-0166544

(51) Int. Cl.
*H01L 23/498* (2006.01)
*H01L 21/48* (2006.01)
*H01L 25/10* (2006.01)
*H01L 25/00* (2006.01)

(52) U.S. Cl.
CPC .......... *H01L 25/105* (2013.01); *H01L 25/50* (2013.01); *H01L 2225/1041* (2013.01); *H01L 2225/1094* (2013.01)

(58) Field of Classification Search
CPC .................. H01L 25/105; H01L 25/50; H01L 2924/18161; H01L 2924/1815; H01L 2924/15331; H01L 2924/15311

USPC ........................................................ 438/107
See application file for complete search history.

(56) References Cited

U.S. PATENT DOCUMENTS

| | | |
|---|---|---|
| 6,919,631 B1 * | 7/2005 | Hoffman ............ H01L 23/3128 257/707 |
| 7,317,247 B2 | 1/2008 | Lee et al. |
| 8,462,511 B2 | 6/2013 | Lee |
| 8,492,911 B2 | 7/2013 | Bachman et al. |
| 8,685,792 B2 | 4/2014 | Chow et al. |
| 8,981,554 B2 | 3/2015 | Kim |
| 9,136,293 B2 | 9/2015 | Yee et al. |

(Continued)

FOREIGN PATENT DOCUMENTS

| | | |
|---|---|---|
| KR | 20140094081 | 7/2014 |
| KR | 1466450 | 11/2014 |
| KR | 1510412 | 4/2015 |

*Primary Examiner* — Sheikh Maruf
(74) *Attorney, Agent, or Firm* — Onello & Mello, LLP

(57) ABSTRACT

In a method of manufacturing a stack package, a first semiconductor chip is formed on a first package substrate. A second semiconductor chip is formed on a second package substrate. A plurality of signal pads and a thermal diffusion member are formed on a lower surface and/or an upper surface of an interposer substrate, the signal pad having a first height and the thermal diffusion member having a second height greater than the first height. The first package substrate, the interposer substrate, and the second package substrate are sequentially stacked on one another such that the thermal diffusion member is in contact with an upper surface of the first semiconductor chip or a lower surface of the second package substrate.

16 Claims, 33 Drawing Sheets

(56) References Cited

U.S. PATENT DOCUMENTS

| | | | | |
|---|---|---|---|---|
| 2002/0079573 A1* | 6/2002 | Akram | | H01L 21/563 |
| | | | | 257/718 |
| 2002/0096755 A1* | 7/2002 | Fukui | | H01L 21/6836 |
| | | | | 257/686 |
| 2002/0130404 A1* | 9/2002 | Ushijima | | H01L 23/16 |
| | | | | 257/686 |
| 2003/0203537 A1* | 10/2003 | Koopmans | | H01L 23/13 |
| | | | | 438/109 |
| 2004/0016939 A1* | 1/2004 | Akiba | | H01L 21/565 |
| | | | | 257/126 |
| 2004/0018661 A1* | 1/2004 | Baek | | H01L 25/105 |
| | | | | 438/109 |
| 2004/0061212 A1* | 4/2004 | Karnezos | | H01L 23/3128 |
| | | | | 257/686 |
| 2004/0119152 A1* | 6/2004 | Karnezos | | H01L 21/563 |
| | | | | 257/686 |
| 2004/0212096 A1* | 10/2004 | Wang | | H01L 23/3128 |
| | | | | 257/777 |
| 2005/0133916 A1* | 6/2005 | Karnezos | | H01L 23/4334 |
| | | | | 257/738 |
| 2006/0043556 A1* | 3/2006 | Su | | H01L 25/03 |
| | | | | 257/686 |
| 2008/0211084 A1 | 9/2008 | Chow et al. | | |
| 2008/0283977 A1* | 11/2008 | Corisis | | H01L 23/13 |
| | | | | 257/666 |
| 2010/0171206 A1* | 7/2010 | Chu | | H01L 21/565 |
| | | | | 257/686 |
| 2011/0024899 A1* | 2/2011 | Masumoto | | H01L 23/49816 |
| | | | | 257/737 |
| 2011/0133325 A1* | 6/2011 | Moon | | H01L 23/3128 |
| | | | | 257/686 |
| 2011/0316119 A1* | 12/2011 | Kim | | H01G 2/065 |
| | | | | 257/532 |
| 2012/0013007 A1* | 1/2012 | Hwang | | H01L 24/32 |
| | | | | 257/738 |
| 2012/0018882 A1* | 1/2012 | Shim, II | | H01L 21/568 |
| | | | | 257/737 |
| 2012/0211885 A1* | 8/2012 | Choi | | H01L 23/3128 |
| | | | | 257/737 |
| 2013/0069218 A1* | 3/2013 | Seah | | H01L 23/13 |
| | | | | 257/712 |
| 2013/0127054 A1* | 5/2013 | Muthukumar | | H01L 23/3121 |
| | | | | 257/738 |
| 2013/0200528 A1* | 8/2013 | Lin | | H01L 21/76877 |
| | | | | 257/774 |
| 2014/0070348 A1* | 3/2014 | Yee | | H01L 27/14618 |
| | | | | 257/432 |
| 2014/0084442 A1 | 3/2014 | Lee et al. | | |
| 2014/0252561 A1* | 9/2014 | Lisk | | H01L 23/5384 |
| | | | | 257/621 |
| 2014/0264840 A1* | 9/2014 | Lin | | H01L 25/105 |
| | | | | 257/737 |
| 2014/0361442 A1* | 12/2014 | Lee | | H01L 23/564 |
| | | | | 257/777 |
| 2015/0084170 A1* | 3/2015 | Im | | H01L 23/3677 |
| | | | | 257/675 |
| 2015/0108643 A1* | 4/2015 | Kim | | H01L 23/5386 |
| | | | | 257/738 |
| 2015/0115467 A1* | 4/2015 | Park | | H01L 23/3128 |
| | | | | 257/774 |
| 2015/0125993 A1* | 5/2015 | Lee | | H01L 21/486 |
| | | | | 438/107 |
| 2016/0013235 A1 | 1/2016 | Yee et al. | | |
| 2016/0056087 A1* | 2/2016 | Wu | | H01L 21/486 |
| | | | | 257/738 |
| 2017/0040266 A1* | 2/2017 | Lin | | H01L 23/5383 |
| 2017/0294422 A1* | 10/2017 | Solimando | | H01L 25/105 |
| 2017/0317057 A1* | 11/2017 | Chen | | H01L 25/50 |

* cited by examiner

STACK PACKAGE AND METHOD OF MANUFACTURING THE STACK PACKAGE

CROSS REFERENCE TO RELATED APPLICATION

This application claims priority under 35 U.S.C. § 119 to Korean Patent Application No. 10-2015-0166544, filed on Nov. 26, 2015 in the Korean Intellectual Property Office (KIPO), the contents of which are herein incorporated by reference in their entirety.

FIELD

The inventive concept relates to a stack package and a method of manufacturing the same. More particularly, aspects of the inventive concept relate to a stack package including an interposer and a method of manufacturing the same.

BACKGROUND

As semiconductor devices have been highly integrated, Package-On-Package (POP) technology, in which a plurality of packages may be stacked on each other, has been developed.

The POP type semiconductor package may include a stack package configuration in which a second semiconductor package is stacked on a first semiconductor package. Each of the first and second semiconductor packages include a semiconductor chip mounted on a semiconductor substrate.

However, it is difficult to dissipate heat generated in the stack package to the surrounding environment. An excess of heat can cause a device in any of the plurality of packages to malfunction or cause a delay in working speed.

SUMMARY

In accordance with aspects of the inventive concept, provided is a stack package having an improved heat removal capacity, which can take various embodiments.

In accordance with other aspects of the inventive concepts, provided is a method of manufacturing a stack package having an improved heat removal capacity, which can take various embodiments.

According to example embodiments, there is provided a method of manufacturing a stack package. In the method, a first semiconductor chip is formed on a first package substrate. A second semiconductor chip is formed on a second package substrate. A plurality of signal pads and a thermal diffusion member are formed on a lower surface or an upper surface of an interposer substrate, the signal pads having a first height and the thermal diffusion member having a second height greater than the first height. The first package substrate, the interposer substrate and the second package substrate are sequentially stacked on one another such that the thermal diffusion member is in contact with an upper surface of the first semiconductor chip or a lower surface of the second package substrate.

According to example embodiments, there is provided a method of manufacturing a stack package. In the method, a first semiconductor chip is formed on a first package substrate. A second semiconductor chip is formed on a second package substrate. A first conductive layer is formed on a lower surface of an interposer substrate. The first conductive layer is partially removed to form a first preliminary thermal diffusion member and a plurality of first signal pads. A second conductive layer is formed on the first preliminary thermal diffusion member to form a first thermal diffusion member. A third conductive layer is formed on an upper surface of the interposer substrate. The third conductive layer is partially removed to form a second preliminary thermal diffusion member and a plurality of second signal pads. A fourth conductive layer is formed on the second preliminary thermal diffusion member to form a second thermal diffusion member. The first package substrate, the interposer substrate and the second package substrate are sequentially stacked on one another such that the first thermal diffusion member is in contact with an upper surface of the first semiconductor chip and the second thermal diffusion member is in contact with a lower surface of the second package substrate.

According to example embodiments, there is provided a method of manufacturing a stack package, comprising: forming a first semiconductor package comprising a first semiconductor chip; forming an interposer on the first semiconductor package; and forming a second semiconductor package comprising a second semiconductor chip on the interposer. Forming the interposer includes forming a plurality of signal pads and a thermal diffusion member on at least one of a lower surface and/or an upper surface of an interposer substrate, the signal pads having a first height and the thermal diffusion member having a second height greater than the first height, such that the thermal diffusion member is in contact with at least one of an upper surface of the first semiconductor chip and/or a lower surface of the second package substrate.

According to example embodiments, thermal diffusion members may be formed in an interposer interposed between semiconductor packages, to thereby effectively dissipate heat from semiconductor chips. Further, the effective heat removal may prevent warpage due to a thermal stress.

BRIEF DESCRIPTION OF THE DRAWINGS

Example embodiments will be more clearly understood from the following detailed description taken in conjunction with the accompanying drawings.

FIGS. 1, 2, 7, 8, 9 and 10 are cross-sectional views illustrating example embodiments of a stack package, in accordance with aspects of the inventive concept.

FIG. 3 is a cross-sectional view illustrating an example embodiment of an interposer that can be included in the stack package, in accordance with aspects of the inventive concept.

FIGS. 4 to 6 are bottom views illustrating example embodiments of the interposer included in the stack package, in accordance with aspects of the inventive concept.

FIGS. 11 and 12 are cross-sectional views illustrating embodiments of an interposer, in accordance with aspects of the inventive concept.

FIGS. 13 and 14 are cross-sectional views illustrating another embodiment of an interposer, in accordance with aspects of the inventive concept.

FIG. 15 is a graph illustrating thermal resistance of stack packages respectively including the interposers in FIGS. 11 to 14, in accordance with aspects of the inventive concept.

FIGS. 16 to 23 and FIGS. 25 to 32 are cross-sectional views illustrating an embodiment of a method of manufacturing a stack package, in accordance with aspects of the inventive.

FIG. 24 is a plan view of the embodiment of FIG. 23.

FIG. 33 is a partially exploded view of an embodiment of a stack package, in accordance with aspects of the inventive concept.

DETAILED DESCRIPTION OF EXAMPLE EMBODIMENTS

Hereinafter, example embodiments will be explained in detail with reference to the accompanying drawings.

Figure 1:
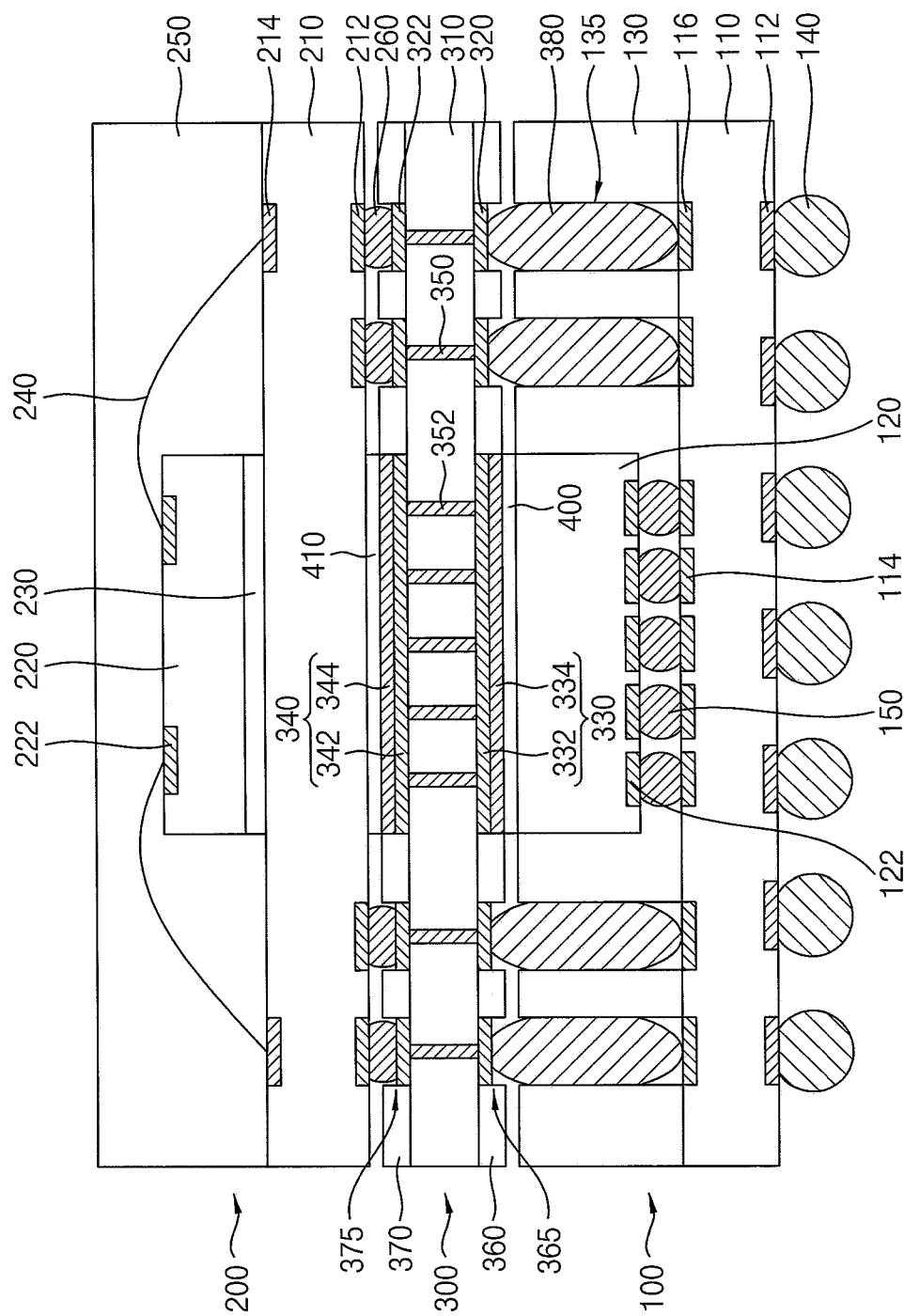
FIGS. 1 to 33 represent non-limiting, example embodiments as described herein.
Figure 2:
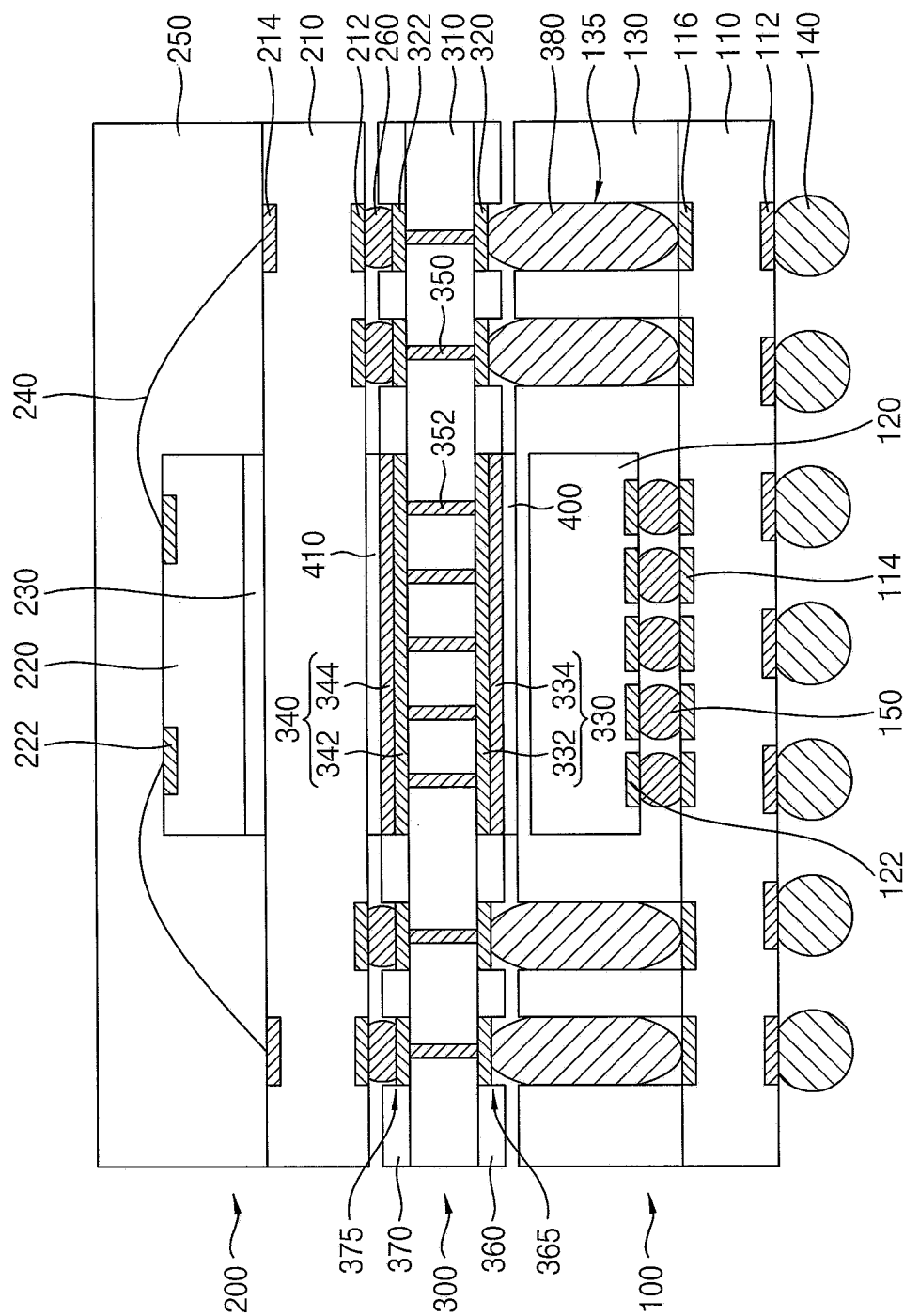
Figure 3:
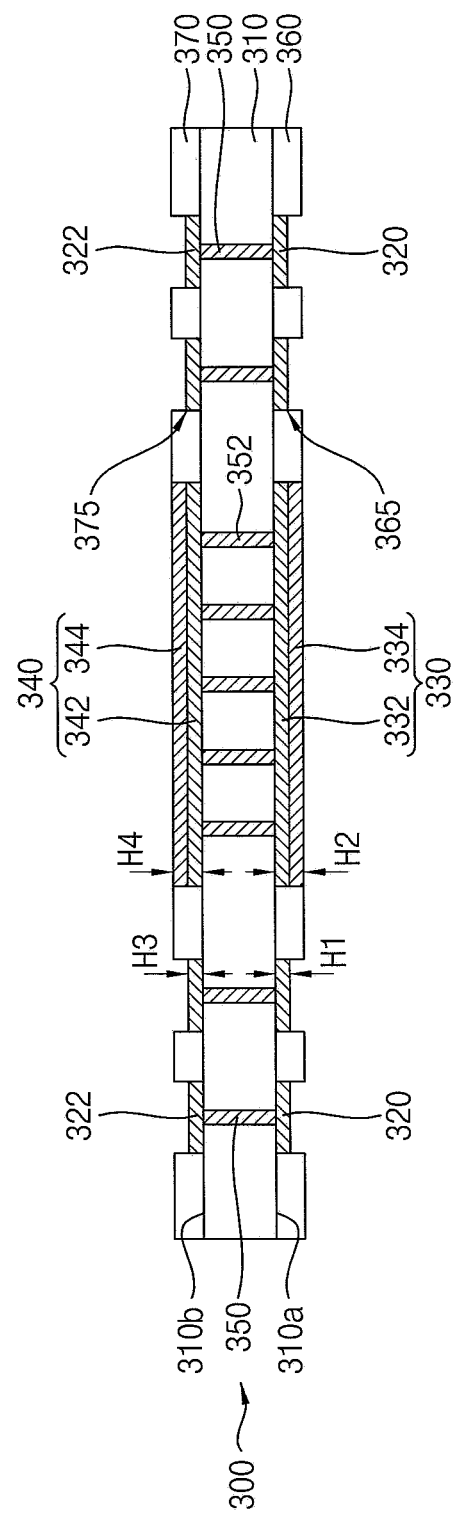
Figure 4:
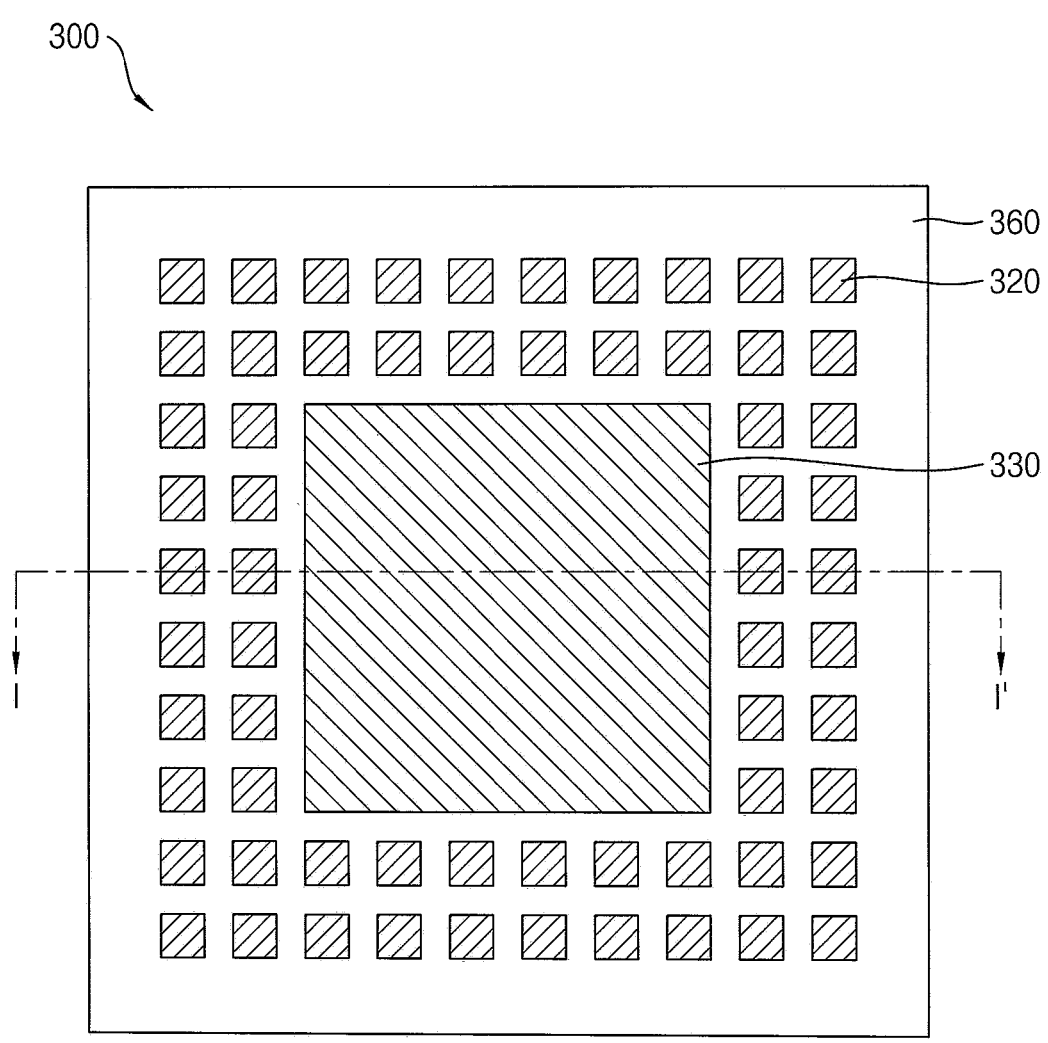
Figure 5:
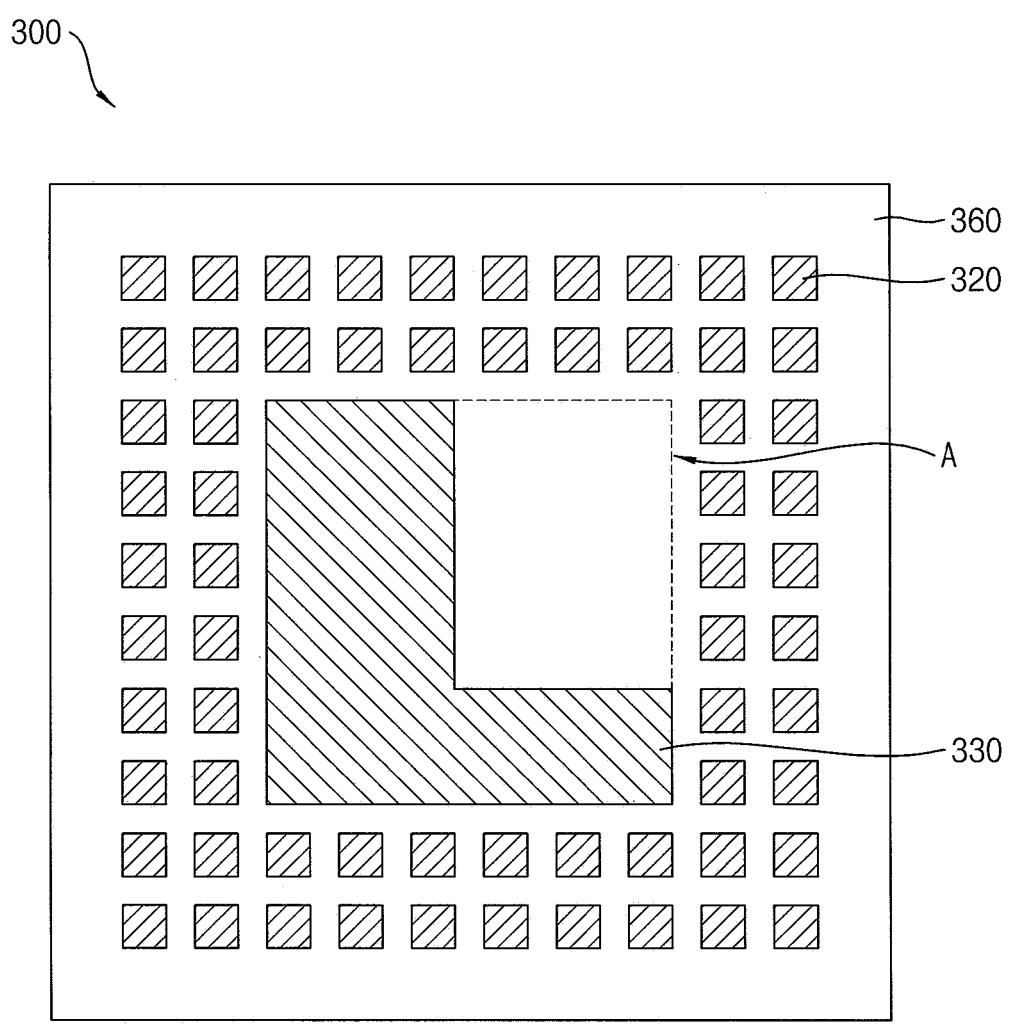
Figure 6:
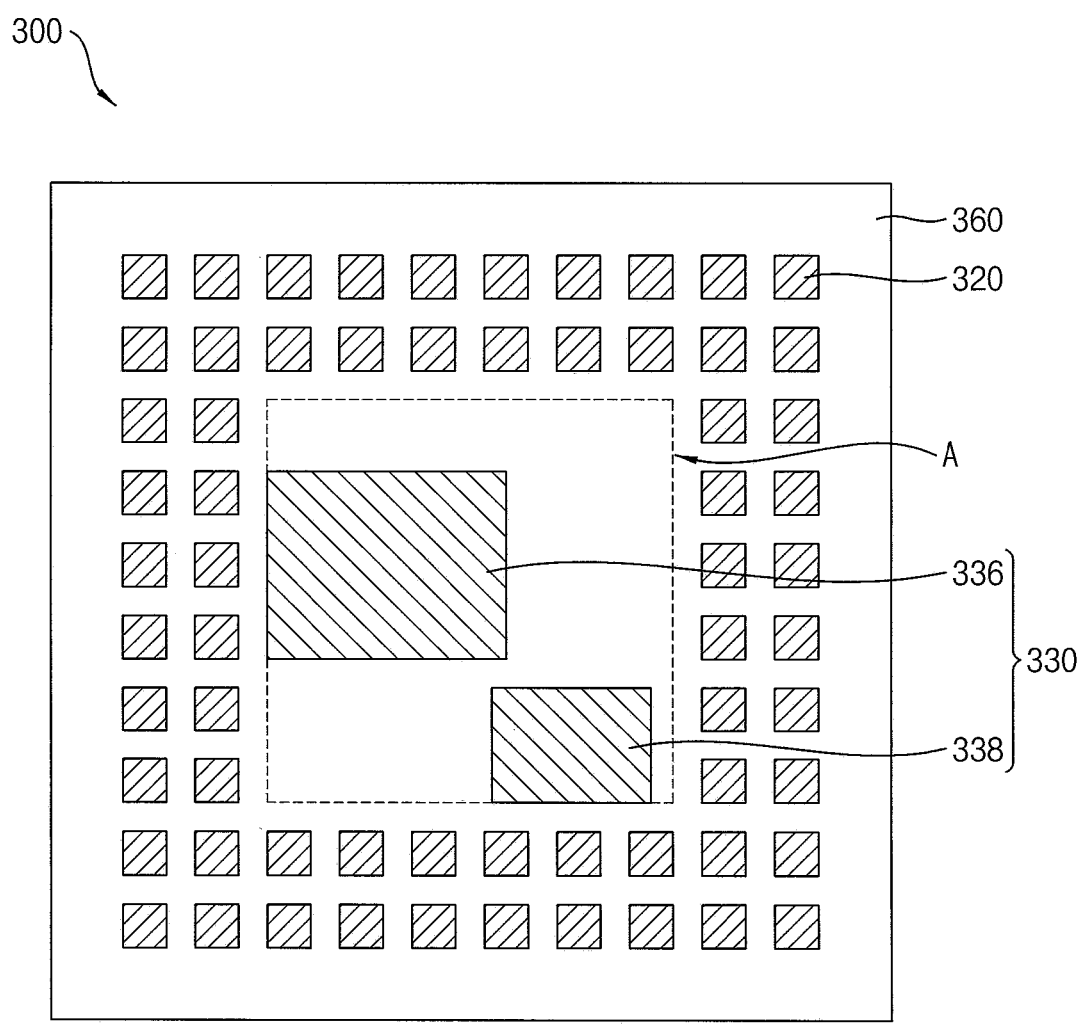

FIGS. 1, 2, 7, 8, 9 and 10 are cross-sectional views illustrating an embodiment of a stack package in accordance with aspects of the inventive concept. FIG. 3 is a cross-sectional view illustrating an embodiment having an interposer included in the stack package in accordance with aspects of the inventive concept. FIGS. 4 to 6 are bottom views illustrating the interposer included in the stack package in accordance with aspects of the inventive concept. FIG. 3 is a cross-sectional view of the stack package of FIG. 4 taken along the line I-I'.

Referring to the embodiment of FIG. 1, a stack package may include a first semiconductor package 100, an interposer 300, and a second semiconductor package 200 sequentially staked on one another.

The first semiconductor package 100 may include a first package substrate 110, a first semiconductor chip 120, and a first molding member 130. The first chip 120 may be disposed on the first package substrate 110 and at least partially surrounded by portions of the first molding member 130.

The first package substrate 110 may be, for example, a printed circuit board (PCB), and may include a plurality of pads, such as the first to third pads 112, 114 and 116 shown. Although it is not illustrated in the figure, the first package substrate 110 may further include various wirings electrically connected to the first to third pads 112, 114 and 116.

In example embodiments, a plurality of the first pads 112 may be arranged on a lower surface of the first package substrate 110 and may be electrically connected to a main board (not illustrated) by an electrical connection structure, such as a first conductive bump 140. The first conductive bump 140 may include, for example, a solder ball in example embodiments. In other embodiments, the electrical connection structure may take another form.

A plurality of the second pads 114 and a plurality of the third pads 116 may be arranged on an upper surface of the first package substrate 110. The second pads 114 may be disposed under the first semiconductor chip 120 and may be electrically connected to the first semiconductor chip 120 by another electrical connection structure, such as a second conductive bump 150. The third pads 116 may be arranged around the first semiconductor chip 120 and may be electrically connected to the interposer 300 by yet another electrical connection structure, such as a third conductive bump 380. The second and third conductive bumps 150 and 380 may include, for example, solder balls in example embodiments.

The first to third pads 112, 114 and 116 may include an electrically conductive material, for example, a metal such as copper, aluminum, etc., or an alloy thereof.

The first semiconductor chip 120 may be mounted on the middle region of the first package substrate 110. For example, the first semiconductor chip 120 may include an application processor (AP) chip, or other processor chip, any of a variety of types of logic chips, and so on.

In various embodiments, the first semiconductor chip 120 may include one or more fourth pad 122. A plurality of the fourth pads 122 may be arranged on a lower surface of the first semiconductor chip 120 corresponding to the second pads 114 of the first package substrate 110. The fourth pads 122 may be electrically connected to the second pad 114 by the second conductive bumps 150.

The first molding member 130 may be provided on the first package substrate 110 to cover at least a portion of the first semiconductor chip 120. For example, the first molding member 130 may include an epoxy molding compound (EMC), for example.

In example embodiments, the first molding member 130 may have first openings 135 that expose the third pads 116 respectively. The third conductive bump 380 may be disposed on the exposed third pad 116.

In example embodiments, the third conductive bump 380 may fill at least a portion of the first opening 135, and a portion of the third conductive bump 380 may protrude from an upper surface of the first molding member 130.

The second semiconductor package 200 may include a second package substrate 210, a second semiconductor chip 220, and a second molding member 250. The first chip 220 may be disposed on the second package substrate 210 and at least partially surrounded by portions of the second molding member 250.

The second package substrate 210 may be, for example, a printed circuit board (PCB), and may include fifth and sixth pads 212 and 214. Although it is not illustrated in the figure, the second package substrate 210 may further include various wirings electrically connected to the fifth and sixth pads 212 and 214.

In example embodiments, a plurality of the fifth pads 212 may be arranged on a lower surface of the second package substrate 210 and may contact one or more electrical connection structure, such as fourth conductive bumps 260. The fourth conductive bumps 260 may include, for example, a solder ball.

A plurality of the sixth pads 214 may be arranged on an upper surface of the second package substrate 210.

The fifth and sixth pads 212 and 214 may include an electrically conductive material, for example, a metal such as copper, aluminum, etc., or an alloy thereof.

The second semiconductor chip 220 may be mounted on the middle region of the second package substrate 210. The second semiconductor chip 220 may be adhered to the upper surface of the second package substrate 210 via an adhesive layer 230. Alternatively, the second semiconductor chip 220 may be mounted on the second package substrate 210 via an electrical connection structure, such as conductive bumps (not illustrated), for example solder balls.

The second semiconductor chip 220 may include one or more bonding pads 222 on an upper surface thereof. A plurality of the bonding pads 222 may be arranged to be exposed through the upper surface of the second semiconductor chip 220. The bonding pads 222 may include an electrically conductive material, for example, a metal such as copper, aluminum, etc., or an alloy thereof.

The bonding pads 222 of the second semiconductor chip 220 may be electrically connected to the sixth pads 214 of the second package substrate 210 by, for example, conductive wires 240, respectively. Alternatively, in other embodiments, when the second semiconductor chip 220 is mounted on the second package substrate via the conductive bumps, the semiconductor chip 220 may be electrically connected to the second package substrate by the conductive bumps, not by the conductive wires 240.

The second semiconductor chip 220 may include or be a memory chip, such as any presently known or hereafter developed memory chip. In other embodiments, the second semiconductor chip me include or be a processor chip, such as microprocessor chip.

The second molding member 250 may include, for example, an insulating material, such as EMC. The second molding member 250 may be formed on the second package substrate 210 to seal and protect the second semiconductor chip 220, the adhesive layer 230, and the conductive wires 240 from the surrounding environment.

In FIG. 1, the second semiconductor package 200 includes one second semiconductor chip, however, the inventive concept and embodiment of FIG. 1 may not be limited thereto. That is, the second semiconductor package 200 may include two or more second semiconductor chips sequentially stacked on each other.

Referring to FIGS. 1 and 3, the interposer 300 may be interposed between the first semiconductor package 100 and the second semiconductor package 200. In various embodiments, the interposer 300 may include an interposer substrate 310, seventh and eighth pads 320 and 322, first and second through vias 350 and 352, first and second thermal diffusion members 330 and 340, and first and second protection layers 360 and 370.

In example embodiments, the interposer 300 may include the first thermal diffusion member 330 in an upper portion and the second thermal diffusion member 340 in a lower portion. Alternatively, the interposer 300 may include only a first thermal diffusion member 330 in the lower portion (e.g., see FIG. 7) or may include only a second thermal diffusion member 340 in the upper portion (e.g., see FIG. 8). Hereinafter, for the convenience of explanation, only the interposer 300 including both of the first and second thermal diffusion members 330 and 340 will be illustrated.

The interposer substrate 310 may include an insulating material, for example, silicon, insulating ceramic, and/or plastic. The seventh pad 320 and the first thermal diffusion member 330 may be disposed on a lower surface of the interposer substrate 310. The eighth pad 322 and the second thermal diffusion member 340 may be disposed on an upper surface of the interposer substrate 310. The seventh and eighth pads 320 and 322 may be electrically connected to each other by respective first through vias 350. The first and second thermal diffusion members 330 and 340 may be thermally coupled to each other by the second through via 352.

In example embodiments, a plurality of the seventh pads 320 may be arranged on the lower surface of the interposer substrate 310 and may be electrically connected to the first package substrate 110 by the third conductive bumps 380. The seventh pads 320 may have a first height or thickness H1 from the lower surface 310a of the interposer substrate 310.

A plurality of the eighth pads 322 may be arranged on the upper surface of the interposer substrate 310 to make contact with the fourth conductive bump 260 to be electrically connected to the second package substrate 210. The eighth pads 322 may have a third height or thickness H3 from the upper surface 310b of the interposer substrate 310.

For example, the third height or thickness H3 may be substantially the same as the first height H1, in some embodiments.

The seventh and eighth pads 320 and 322 may include a conductive material, for example, a metal such as copper, aluminum, etc., or an alloy thereof.

The first through via 350 may penetrate through the interposer substrate 310 to electrically connect the seventh pads 320 and the eighth pads 322 to each other, respectively.

The first through via 350 may include a conductive material, for example, a metal such as copper, aluminum, etc., or an alloy thereof. Although it is not illustrated in the figures, the interposer 300 may further include inner wirings for electrically connecting the first through vias 350.

The first package substrate 110 and the second package substrate 210 may be electrically connected to each other by the seventh pads 320, the first through via 350 and the eighth via 322. As the first and second semiconductor packages 100 and 300 are connected by the interposer 300 with a plurality of the pads 320 and 322, the area required for input/output patterns may be prevented from being limited when stacking the semiconductor packages.

The first thermal diffusion member 330 may be arranged in the middle region on the lower surface of the interposer substrate 310. The first thermal diffusion member 330 may be disposed corresponding to the first semiconductor chip 120 to cover the whole upper surface of the first semiconductor chip 120. For example, as illustrated in the top view of FIG. 4, the first thermal diffusion member 330 may have a square or rectangular plan shape, and the seventh pads 320 may be arranged around the first thermal diffusion member 330. The first thermal diffusion member 330 may be structured and arranged to diffuse heat generated from the first semiconductor chip 120 to the surroundings to thereby prevent the first semiconductor chip 120 from being overheated.

In some example embodiments, as illustrated in FIGS. 5 and 6, the first thermal diffusion member 330 may be disposed to cover a portion or portions of the first semiconductor chip 120.

The first semiconductor chip 120 may include heat generating portions, such as CPU (central processor unit), GPU (graphic processor unit), etc. The first thermal diffusion member 330 may be structured and arranged to cover the heat generating portions (e.g., see FIG. 5), but not the whole upper surface, of the first semiconductor chip 120. In some embodiments, the first thermal diffusion member 330 may be structured and arranged to only cover the heat generating portions of the first semiconductor chip 120. Alternatively, the first thermal diffusion member 330 may cover a plurality of the heat generating portions (see FIG. 6). For example, as illustrated in the embodiment of FIG. 6, the first thermal diffusion member 330 may include a first thermal diffusion portion 336 that is structured and arranged to cover the CPU portion and a second thermal diffusion portion 338 that is structured and arranged to cover the GPU portion. For the convenience of explanation, only the first thermal diffusion member 330 covering the whole upper surface of the first semiconductor chip 120 will be discussed.

Figure 7:
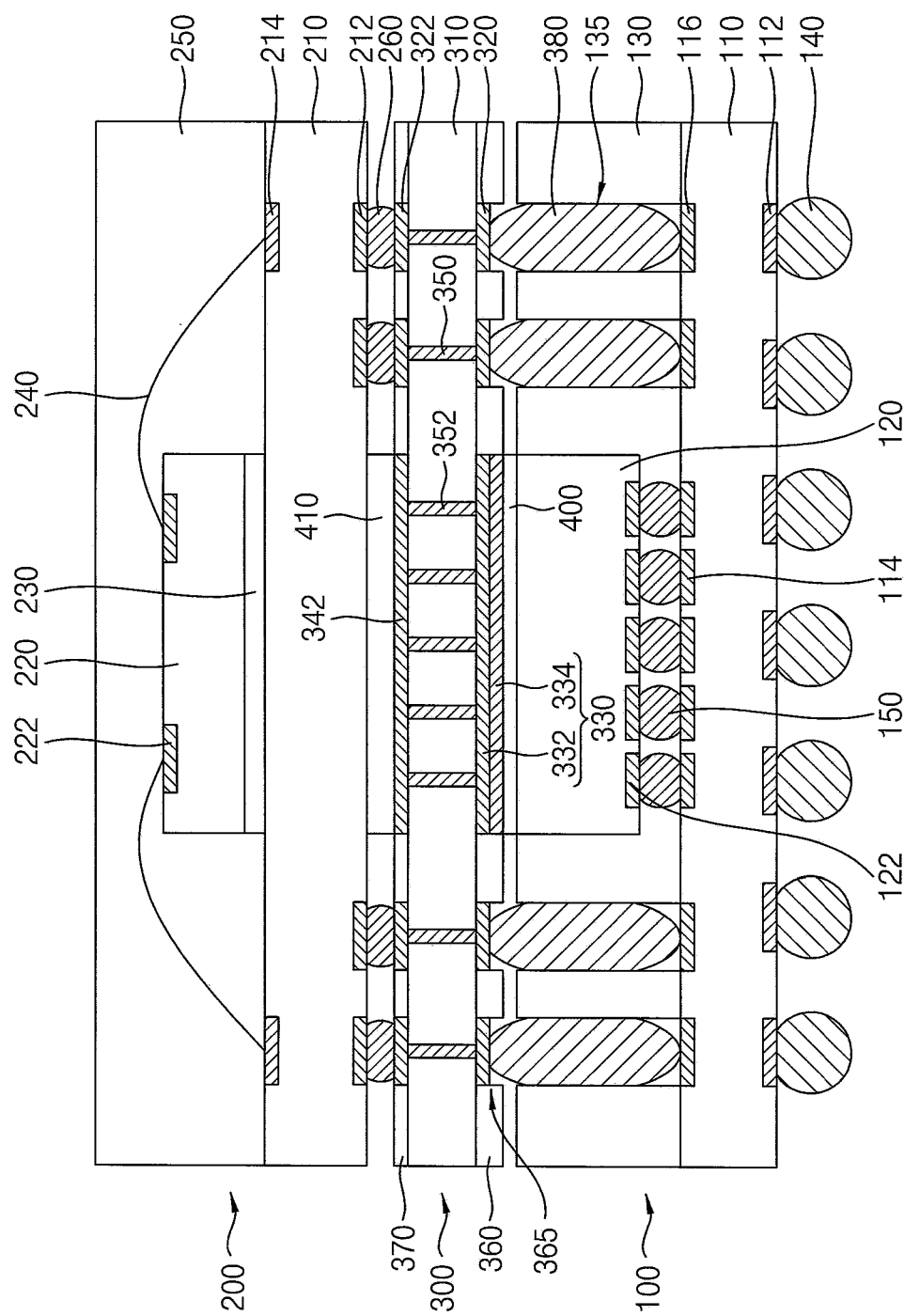
Figure 8:
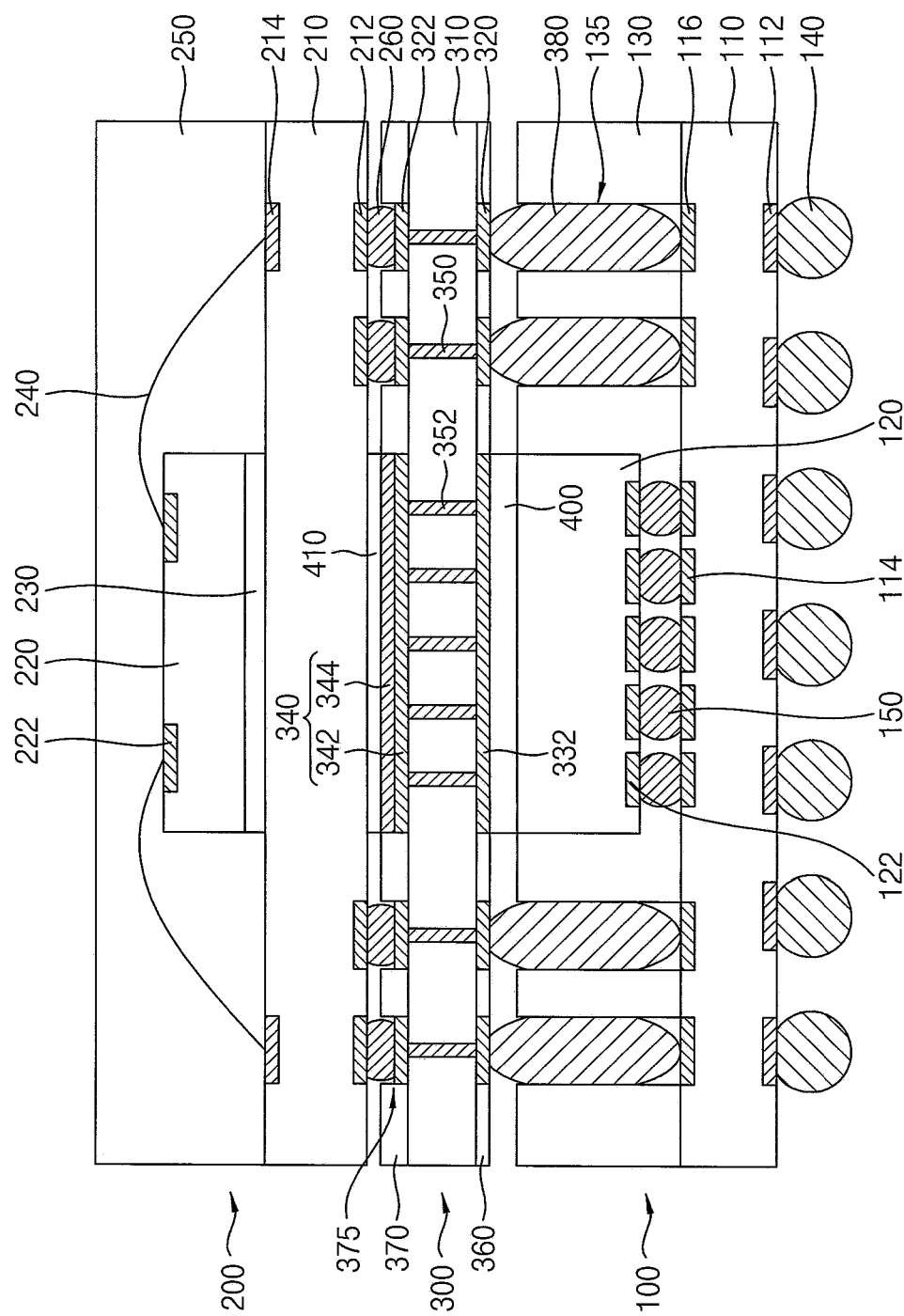

Referring to FIGS. 1, 3, and 7, the first thermal diffusion member 330 may include at least one first dummy pad 332 and at least one first heat dissipating pad 334.

The first dummy pad 332 may be disposed on the lower surface of the interposer substrate 310. The first dummy pad 332 may include a material having excellent heat conductivity, for example, a metal such as copper, aluminum, etc., or an alloy thereof, graphene, graphite, etc. The first dummy pad 332 may include a material substantially the same as the seventh pads 320.

The first heat dissipating pad 334 may be disposed on the first dummy pad 332. The first heat dissipating pad 334 may include a material having excellent heat conductivity, for example, a metal such as copper, aluminum, etc., or an alloy thereof, graphene, graphite, etc. The first heat dissipating pad 334 may include a material substantially the same as the first dummy pad 332. In this case, the first heat dissipating pad 334 may be integrally formed with the first dummy pad 332.

In example embodiments, the first thermal diffusion member 330 may have a second height or thickness H2 from a first surface 310a of the interposer substrate 310 that is higher than the first height H1 of the seventh pad 320. Thus, the first thermal diffusion member 330 may have a sufficient thickness so that heat from the first semiconductor chip 120 may be effectively dissipated in a horizontal direction parallel with the upper surface of the first semiconductor chip 120. In such embodiments, the first surface 310a may be the lower surface of the interposer substrate 310.

The first dummy pad 332 may have a height substantially the same as the first height H1 of the seventh pad 320 from the first surface 310a of the interposer substrate 310. In this embodiment, the first heat dissipating pad 334 beneath the first dummy pad 332 may have a surface at the second height H2 that is greater than the height H1 of the seventh pad 320 from the first surface 310a.

In example embodiments, as shown in FIG. 1, for example, the interposer 300 may further include a first thermal interface material (TIM) layer 400 between the first semiconductor chip 120 and the first thermal diffusion member 330. A lower surface of the first thermal interface material layer 400 may make contact with the upper surface of the first semiconductor chip 120 and an upper surface of the first thermal interface material layer 400 may make contact with a lower surface of the first heat dissipating pad 334.

The first thermal interface material layer 400 may include, for example, thermal grease, thermal epoxy, etc. The first thermal interface material layer 400 may decrease a contact thermal resistance to improve heat dissipation from the first semiconductor chip 120 to the first heat dissipating pad 334.

Figure 9:
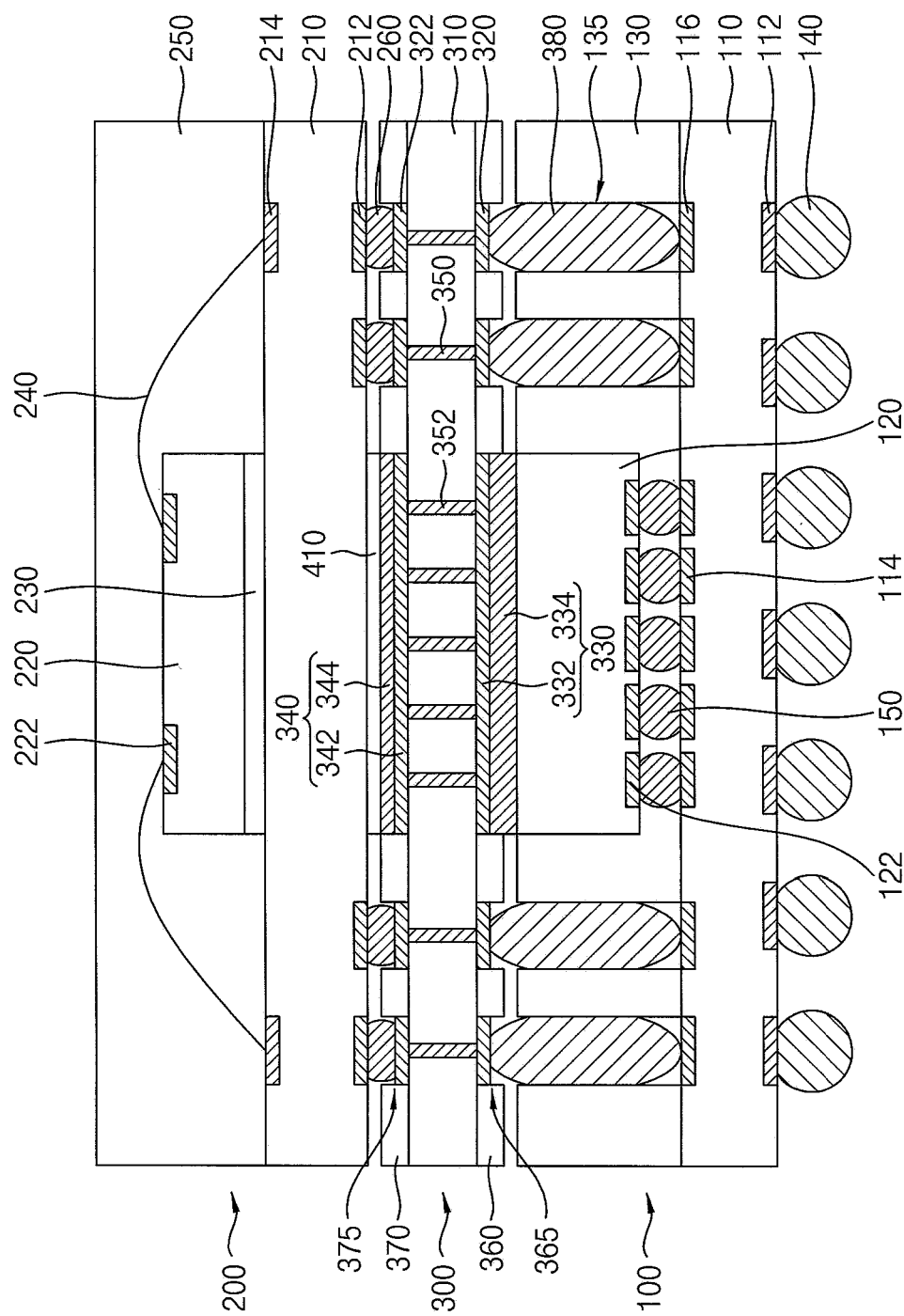
Figure 10:
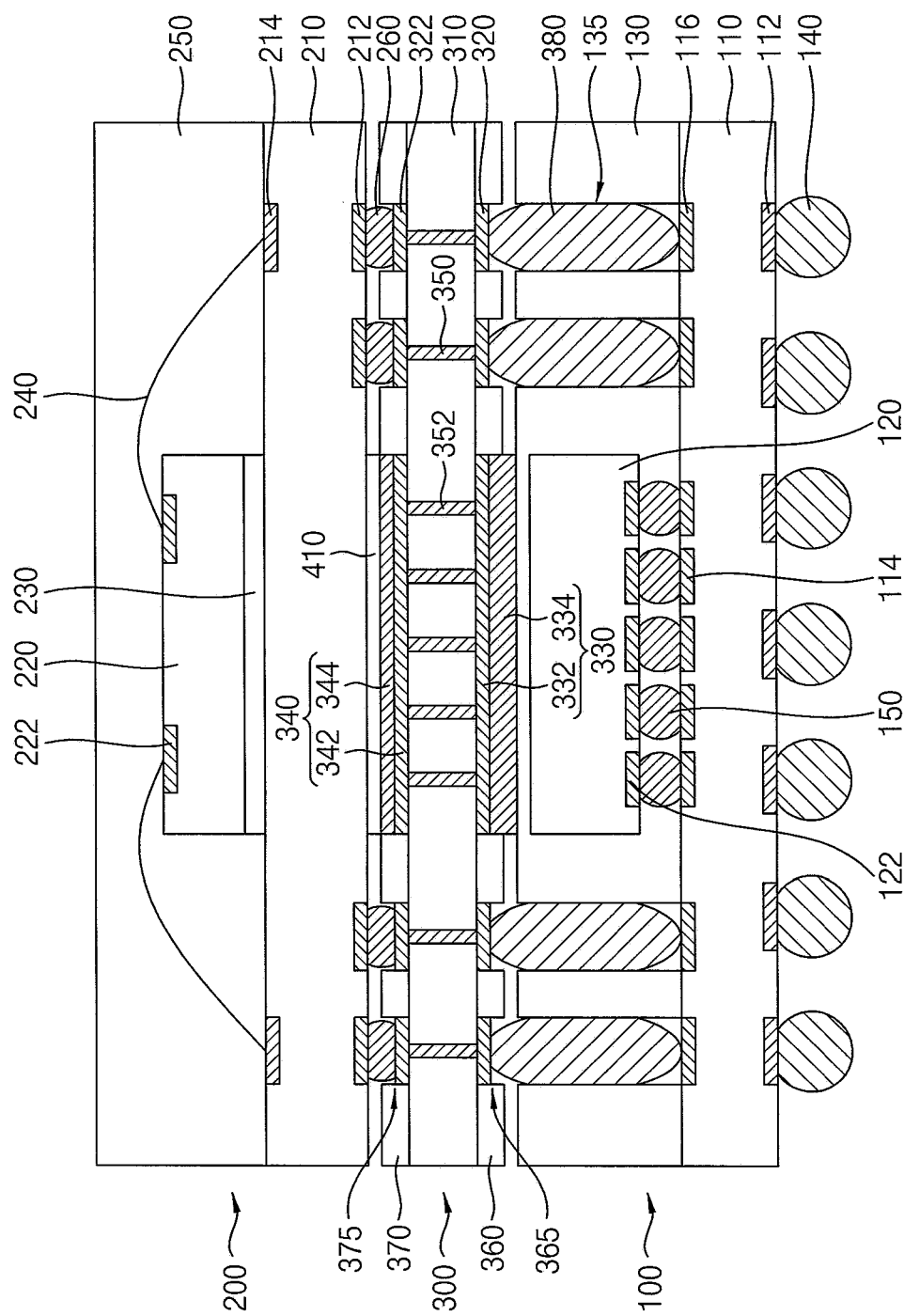

Alternatively, the first thermal interface material layer 400 may be removed or omitted, as not being necessary. In this case, the first thermal diffusion member 330 may make contact with the first semiconductor chip 120 (e.g., see FIG. 9) or may make contact with the first molding member 130 (e.g., see FIG. 10). In FIGS. 9 and 10, a lower surface of the first thermal diffusion member 330 may protrude beyond a lower surface of the first protection layer 360, however, it may not be limited thereto, and the lower surface of the first thermal diffusion member 330 may be coplanar with the lower surface of the first protection layer 360 in other embodiments.

In example embodiments, the first thermal diffusion member 330 may be connected to a ground. For example, the first semiconductor package 100 may further include a ground pad (not illustrated) connected to an electrical ground, and the first thermal diffusion member 330 may be connected to the ground pad. In this case, heat generated from the first semiconductor chip 120 and/or the second semiconductor chip 220 may be dissipated to the surrounding environment through the ground pad and connection.

The second thermal diffusion member 340 may be arranged in the middle region on the upper surface of the interposer substrate 310. The second thermal diffusion member 340 may be disposed corresponding to the first thermal diffusion member 330. The second thermal diffusion member 340 may have a shape substantially the same as the first thermal diffusion member 330. For example, the second thermal diffusion member 340 may have a square or rectangular plan shape to cover the whole upper surface of the first semiconductor chip 120 (e.g., see FIG. 4). Alternatively, the second thermal diffusion member 340 may cover only a portion (e.g., one or more heat generating portion) of the first semiconductor chip 120 (e.g., see FIG. 5) or may include a plurality of thermal diffusion portions structured and arranged to cover a plurality of the heat generating portions (e.g., see FIG. 6). Further, the second thermal diffusion member 340 may have a different shape from the first thermal diffusion member 330, as desirable or necessary.

In various embodiments, the second thermal diffusion member 340 may include a second dummy pad 342 and a second heat dissipating pad 344.

The second dummy pad 342 may be disposed on the upper surface of the interposer substrate 310. The second dummy pad 342 may include a material having excellent heat conductivity, for example, a metal such as copper, aluminum, etc., or an alloy thereof, graphene, graphite, etc.

The second heat dissipating pad 344 may be disposed on the second dummy pad 342. The second heat dissipating pad 344 may include a material having excellent heat conductivity, for example, a metal such as copper, aluminum, etc., or an alloy thereof, graphene, graphite, etc. The second heat dissipating pad 344 may include a material substantially the same as the second dummy pad 342. In this case, the second heat dissipating pad 344 may be integrally formed with the second dummy pad 342.

In example embodiments, the second thermal diffusion member 340 may have a fourth height or thickness H4 from a second surface 310b of the interposer substrate 310 higher than the third height H3 of the eighth pad 322. Thus, the second thermal diffusion member 340 may have a sufficient thickness to thereby effectively dissipate heat to the surrounding environment. In such a case, the second surface 310b may be the upper surface of the interposer substrate 310.

The second dummy pad 342 may have a height substantially the same as the third height H3 of the eighth pad 322 from the second surface 310b of the interposer substrate 310. In various embodiments, the second heat dissipating pad 344 on the second dummy pad 342 may have a surface at the fourth height H4 that is greater than the height H3 of the eighth pad 322 from the second surface 310b.

In example embodiments, the interposer 300 may further include a second thermal interface material (TIM) layer 410 disposed between the second package substrate 210 and the second thermal diffusion member 340. An upper surface of the second thermal interface material layer 410 may make contact with the lower surface of the second package substrate 210 and a lower surface of the second thermal interface material layer 410 may make contact with an upper surface of the second heat dissipating pad 344.

The second thermal interface material layer 410 may include, for example, thermal grease, thermal epoxy, etc. The second thermal interface material layer 410 may decrease a contact thermal resistance between the interposer 300 and the second package substrate 210.

Alternatively, the second thermal interface material layer 410 may be omitted or removed, as not being necessary. In this case, the second thermal diffusion member 340 may make contact with the second package substrate 210 or may be spaced apart from the second package substrate 210.

In example embodiments, the second thermal diffusion member 340 may be connected to an electrical ground. For example, the second semiconductor package 200 may further include a ground pad (not illustrated) connected to the ground, and the second thermal diffusion member 340 may be connected to the ground pad. In this case, heat generated from the first semiconductor chip 120 and/or the second semiconductor chip 220 may be dissipated to the surrounding environment through the ground pad and connection.

The second through via 352 may penetrate through the interposer substrate 310 to thermally couple the first thermal diffusion member 330 and the second thermal diffusion member 340 to each other. The second through via 352 may include a material having excellent heat conductivity, for example, a metal such as copper, aluminum, etc., or an alloy thereof. Thus, heat generated from the first semiconductor chip 120 may be transferred to the second package substrate 210 through the first thermal diffusion member 330, the second through via 352, and the second thermal diffusion member 340. On the other hand, heat generated from the second package substrate 210 may be dissipated to the surrounding environment through the second thermal diffusion member 340, the second through via 352, and the first thermal diffusion member 330.

The second through via 352 may include a conductive material substantially the same as the first through via 350, for example, a metal such as copper, aluminum, etc., or an alloy thereof. Alternatively, the second through via 352 may include a different material from the first through via 350. For example, the first through via 350 may include a material having excellent electrical conductivity and the second through via 352 may include a material having excellent heat conductivity.

The first protection layer 360 may be provided on the lower surface of the interposer substrate 310 to expose at least portions of the first thermal diffusion member 330 and the seventh pad 320. The first protection layer 360 may include, for example, photosensitive solder resist.

The first thermal diffusion member 330 and the seventh pad 320 may include, for example, copper. In this case, copper may be oxidized by air, may be damaged easily by an external impact, and may be contacted unintentionally by a solder ball in the packaging process. The first protection layer 360 may cover the first thermal diffusion member 330 and the seventh pad 320 to protect them from the outside elements and prevent undesired connections with other conductive elements.

In example embodiments, the first protection layer 360 may cover a side surface of the first thermal diffusion member 330, and thus, a bottom surface of the first thermal diffusion member 330 may be exposed by the first protection layer 360. The first protection layer 360 may expose at least a portion of the seventh pad 320 by a first recess 365. The exposed seventh pad 320 may be electrically connected to the first package substrate 110 by the third conductive bump 380.

The second protection layer 370 may be provided on the upper surface of the interposer substrate 310 to expose at least portions of the second thermal diffusion member 340 and the eighth pad 322. The second protection layer 370 may cover the second thermal diffusion member 340 and the eighth pad 322 to protect them from the outside elements and prevent undesired connections with other conductive elements. The second protection layer 370 may include, for example, photosensitive solder resist.

In example embodiments, the second protection layer 370 may cover a side surface of the second thermal diffusion member 340, and thus, a top surface of the second thermal diffusion member 340 may be exposed by the second protection layer 370. The second protection layer 370 may expose at least a portion of the eighth pad 322 by a second recess 375. The exposed eighth pad 322 may be electrically connected to the second package substrate 210 by the fourth conductive bump 260.

As mentioned above, the first semiconductor chip 120 may include the heat generating portions, e.g., such as a CPU and/or a GPU (graphic processor unit) therein. The heat generated from the heat generating portions may be transferred to the first thermal diffusion member 330 via the first thermal interface material layer 400. Heat in the first thermal diffusion member 330 may be dissipated in the horizontal direction through the side surface of the first thermal diffusion member 330. Here, the first thermal diffusion member 330, including a double layer of the first dummy pad 332 and the first heat dissipating pad 334, may have a sufficient thickness to thereby improve heat removal capacity in the horizontal direction parallel with the upper surface of the first semiconductor chip 120. Additionally, the heat in the first thermal diffusion member 330 may be dissipated in a direction perpendicular to the upper surface of the first semiconductor chip 120 through the second through via 352 and the second thermal diffusion member 340. In this case, a plurality of the second through vias 352 may be disposed between the first thermal diffusion member 330 and the second thermal diffusion member 340, to thereby maximize the heat removal capacity. Further, the internal heat in the stack package may be dissipated to the surrounding environment, to thereby prevent warpage due to a thermal stress.

In FIG. 1, the stack package includes two semiconductor packages 100 and 200 and the interposer 300 interposed therebetween, however, it may not be limited thereto, and the stack package may include three or more sequentially stacked semiconductor packages and two or more interposers interposed therebetween.

Figure 11:
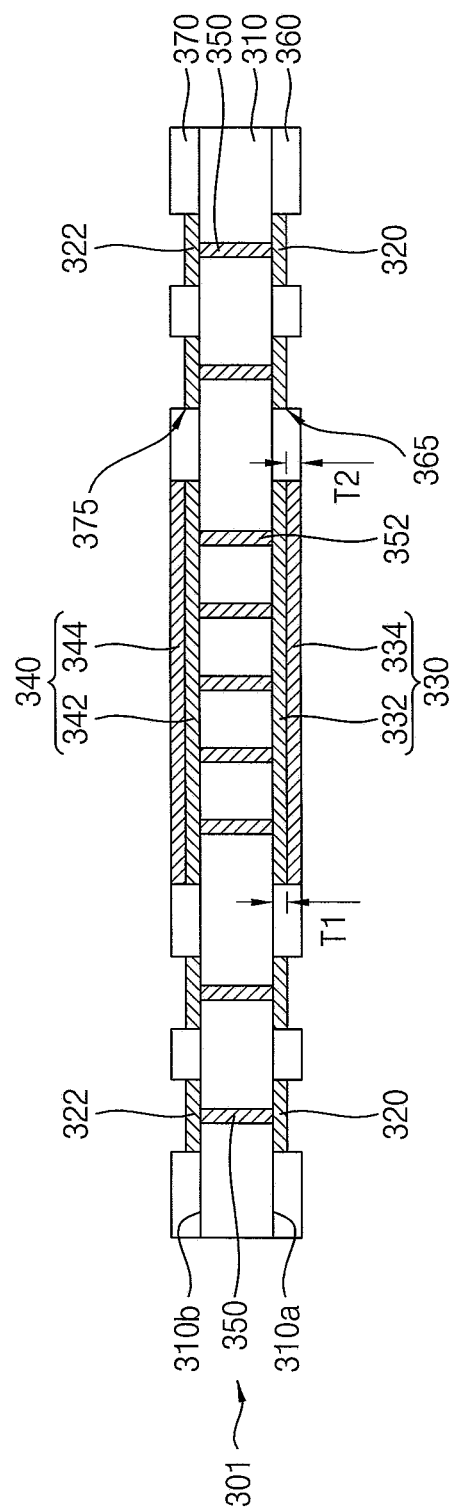
Figure 12:
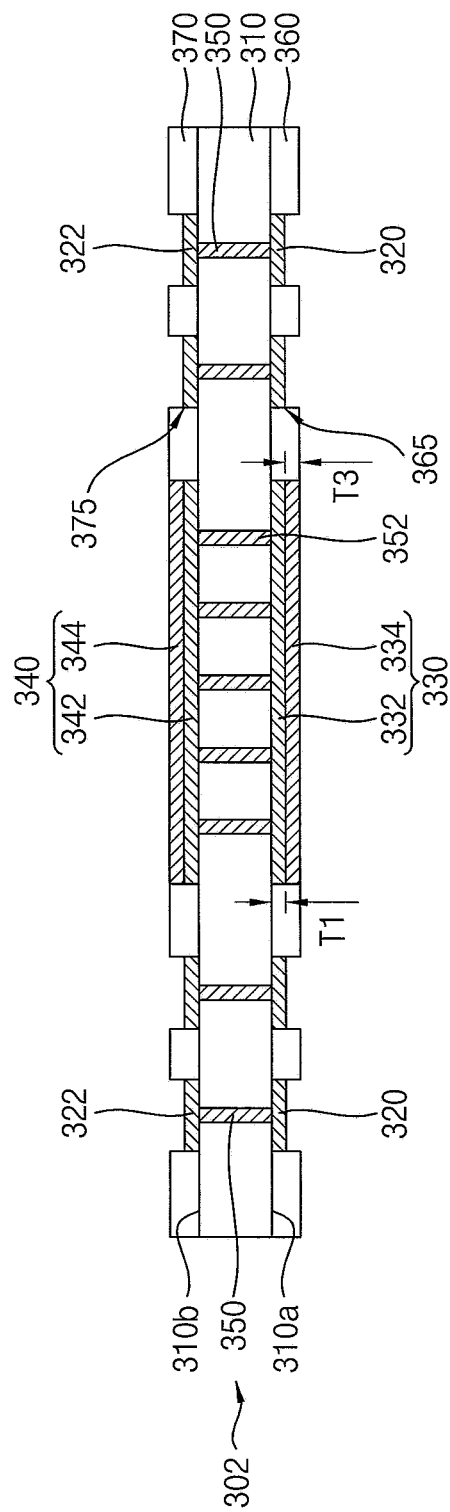
Figure 13:
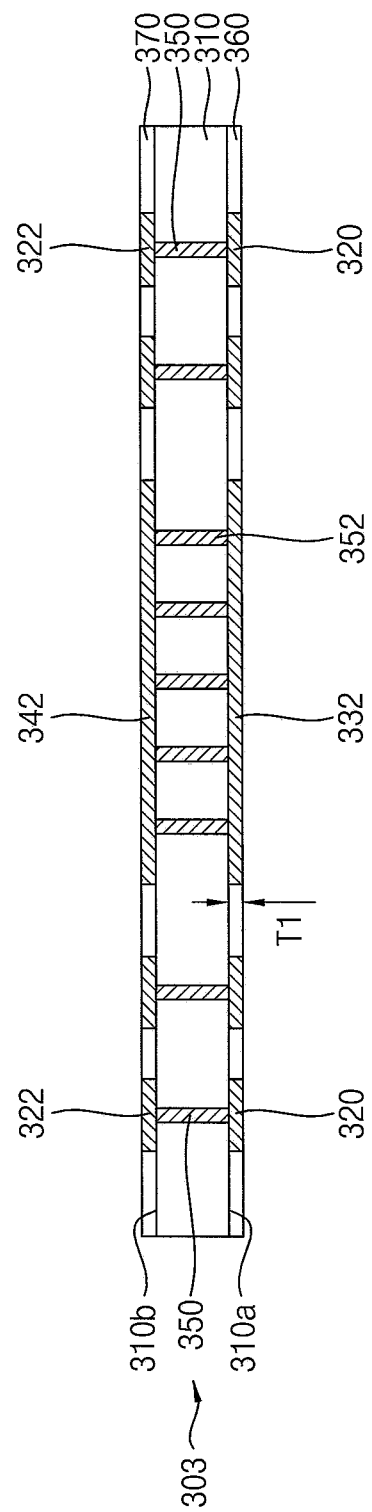
Figure 14:
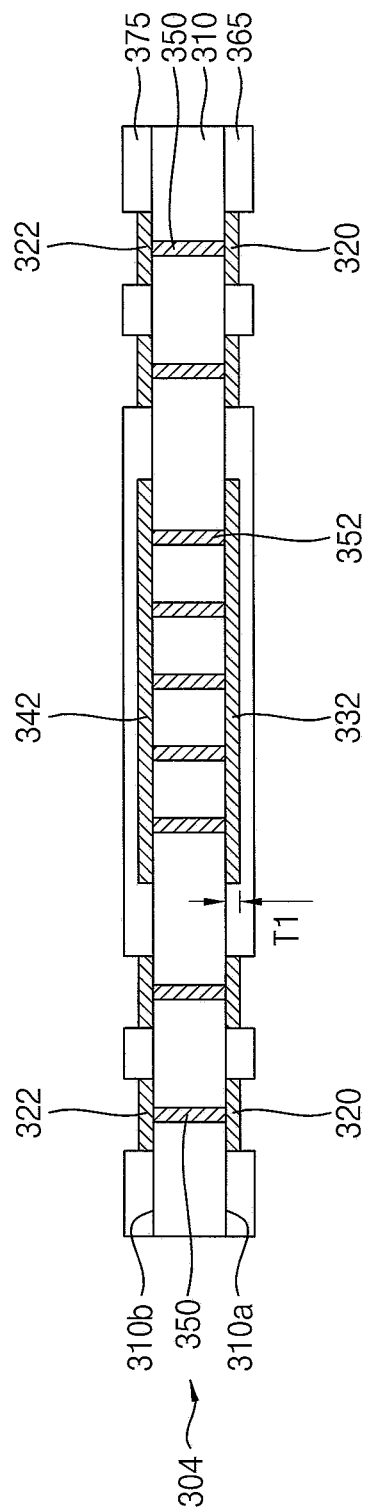
Figure 15:
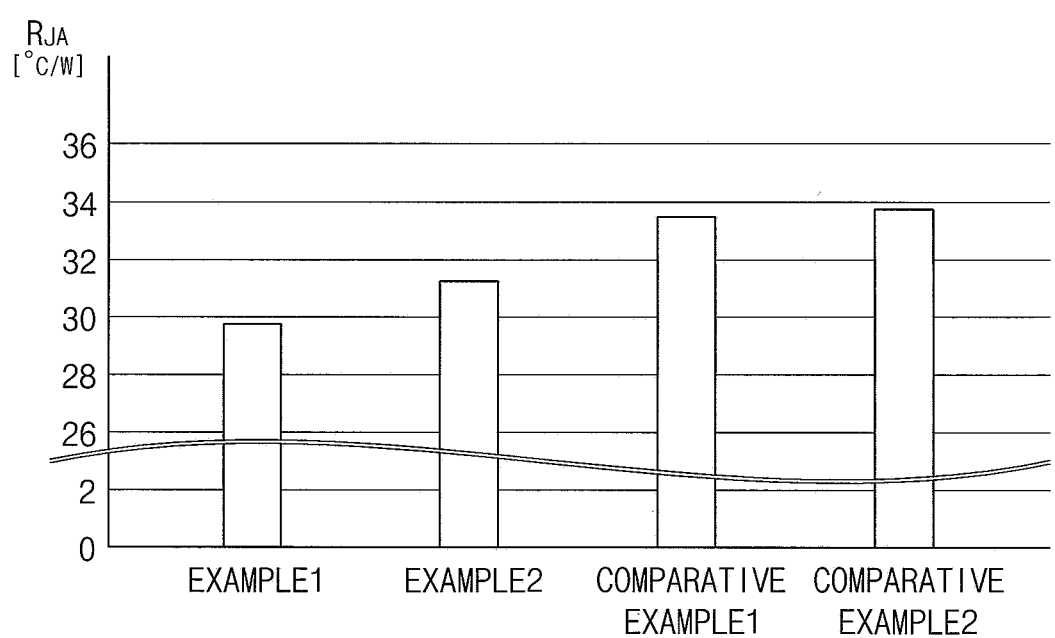

FIGS. 11 and 12 are cross-sectional views illustrating further example embodiments of an interposer, in accordance with aspects of the inventive concept. FIGS. 13 and 14 are cross-sectional views illustrating comparative example embodiments of an interposer, in accordance with aspects of the inventive concept. The interposes in FIGS. 11 to 14 may be substantially the same as or similar to the interposer 300 described with reference to FIG. 3, except for a thermal diffusion member and/or a protection layer. Thus, any further repetitive explanation concerning the above elements will be omitted. For the convenience of explanations, only the interposer is illustrated in FIGS. 11 to 14. Further, a first semiconductor package 100 may be provided beneath the interposer and a second semiconductor package 200 may be provided on the interposer. FIG. 15 is a graph illustrating thermal resistance of stack packages respectively including the interposers in FIGS. 11 to 14.

Example 1

Referring to the embodiment of FIG. 11, an interposer 301 may include an interposer substrate 310, a first thermal diffusion member 330, and a second thermal diffusion member 340. The first thermal diffusion member 330 may be provided on a first surface 310a of the interposer substrate 310. The first thermal diffusion member 330 may include a first dummy pad 332 having a first thickness T1 and a first heat dissipating pad 334 having a second thickness T2. In this embodiment, the first thickness T1 is 13 μm and the second thickness T2 is 24 μm.

A bottom surface of the first heat dissipating pad 334 may be exposed by a first protection layer 360. First and second semiconductor packages are stacked sequentially with the interposer 301 interposed therebetween to provide a stack package.

The junction to ambient thermal resistance (RJA) of the stack package was measured according to JEDEC (Joint Electron Device Engineering Council) standard.

In this case, the thermal resistance means a temperature change per watt. That is, the thermal resistance (° C./W) is a measurement of a temperature difference by which an object or material resists a heat flow. When the measured thermal resistance is high, it represents that an internal heat in the stack package may not be dissipated effectively.

Example 2

Referring to the embodiment of FIG. 12, an interposer 302 may include an interposer substrate 310, a first thermal diffusion member 330, and a second thermal diffusion member 340. The first thermal diffusion member 330 may be provided on a first surface 310a of the interposer substrate 310. The first thermal diffusion member 330 may include a first dummy pad 332 having a first thickness T1 and a first heat dissipating pad 334 having a second thickness T2. In this embodiment, the first thickness T1 is 13 μm and the second thickness T2 is 12 μm.

A bottom surface of the first heat dissipating pad 334 may be exposed by a first protection layer 360. First and second semiconductor packages are stacked sequentially with the interposer 302 interposed therebetween to provide a stack package.

The thermal resistance of the stack package was measured according to JEDEC standard.

Comparative Example 1

Referring to the embodiment of FIG. 13, an interposer 303 may include an interposer substrate 310, a first thermal diffusion member, and a second thermal diffusion member. The first thermal diffusion member may be provided on a first surface 310a of the interposer substrate 310. The first thermal diffusion member may include a first dummy pad 332 having a first thickness T1. In this embodiment, the first thickness T1 is 13 μm.

A bottom surface of the first dummy pad 332 may be exposed by a first protection layer 360. First and second semiconductor packages are stacked sequentially with the interposer 303 interposed therebetween to provide a stack package.

The thermal resistance of the stack package was measured according to JEDEC standard to compare the thermal resistances of Examples 1 and 2.

Comparative Example 2

Referring to the embodiment of FIG. 14, an interposer 304 may include an interposer substrate 310, a first thermal diffusion member, and a second thermal diffusion member. The first thermal diffusion member may be provided on a first surface 310a of the interposer substrate 310. The first thermal diffusion member may include a first dummy pad 332 having a first thickness T1. The first thickness T1 is 13 μm.

First and second protection layers 365 and 375 may cover the first and second dummy pads 332 and 342 respectively. Thus, a bottom surface of the first dummy pad 332 may not be exposed by the first protection layer 365. First and second semiconductor packages are stacked sequentially with the interposer 304 interposed therebetween to provide a stack package.

The thermal resistance of the stack package was measured according to JEDEC standard to compare with Examples 1 and 2.

Referring to FIG. 15, thermal resistance of Example 1 was measured with 29.8° C./W, thermal resistance of Example 2 was measured with 31.1° C./W, thermal resistance of Comparative Example 1 was measured with 33.5° C./W, and thermal resistance of Comparative Example 2 was measured with 33.8° C./W.

When comparing Comparative Example 1 with Comparative Example 2, thermal resistance of Comparative Example 1 was about less 0.8% when compared with that of Comparative Example 2. It represents that when the thermal diffusion member having heat conductivity higher than the protection layer is in contact with the first and second semiconductor packages, the heat removal capacity may be improved.

When comparing Examples 1 and 2 with Comparative Example 2, thermal resistance of Example 1 was reduced by less than about 11.8% and thermal resistance of Example 2 was reduced by less than about 8.0% when compared with that of Comparative Example 2. It represents that when the thermal diffusion member has a sufficient thickness, the heat removal capacity may be improved.

Figure 23:
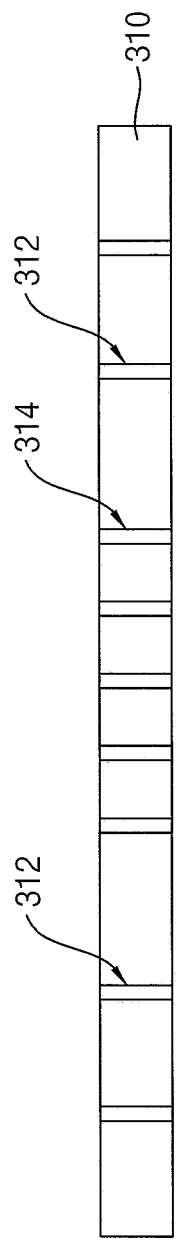
Figure 24:
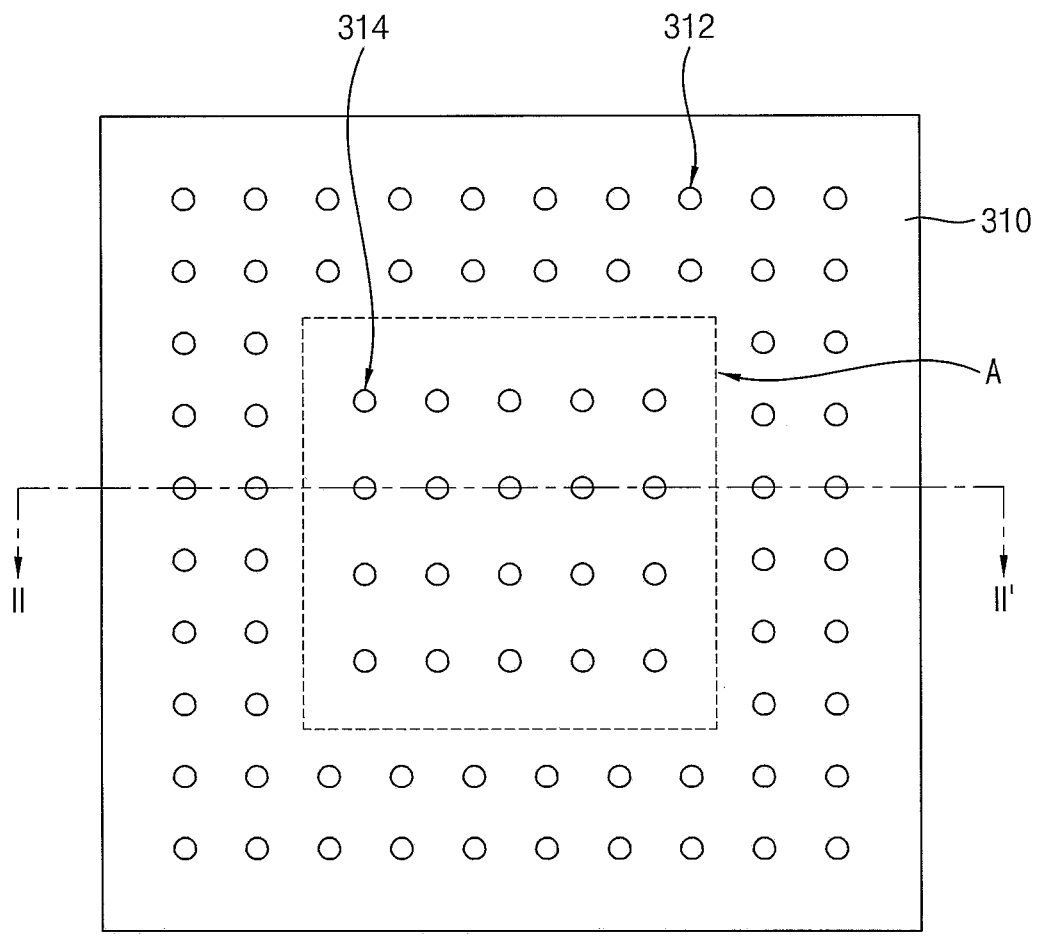

FIGS. 16 to 23 and FIGS. 25 to 33 are cross-sectional views illustrating an embodiment of a method of manufacturing a stack package, in accordance with aspects of the inventive concept. FIG. 24 is a plan view of the embodiment of FIG. 23. FIG. 23 is a cross-sectional view taken along the line II-II' in FIG. 24.

Figure 16:
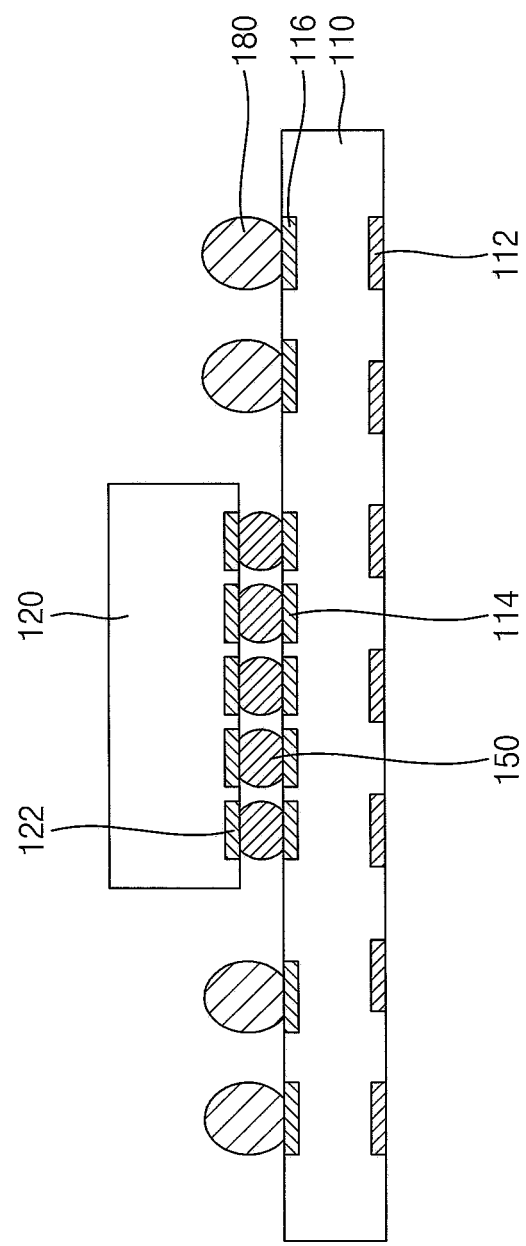

Referring to the embodiment of FIG. 16, a semiconductor chip 120 may be mounted on a first package substrate 110, and fifth conductive bumps 180 may be disposed on an upper surface of the first package substrate 110.

The first package substrate 110 may be, for example, a printed circuit board (PCB), and may include first to third pads 112, 114 and 116. Although it is not illustrated in the figure, the first package substrate 110 may further include various wirings and/or through vias electrically connected to the first to third pads 112, 114 and 116.

In example embodiments, a plurality of the first pads 112 may be arranged on a lower surface of the first package substrate 110. A plurality of the second pads 114 and a plurality of the third pads 116 may be arranged on the upper surface of the first package substrate 110. The second pad 114s may be disposed under the first semiconductor chip 120. The third pads 116 may be arranged around the first semiconductor chip 120. The first to third pads 112, 114 and 116 may include or be formed from a conductive material, for example, a metal such as copper, aluminum, etc., or an alloy thereof.

The first semiconductor chip 120 may be mounted on the first package substrate 110 by second conductive bumps 150. For example, the second conductive bumps 150, such as solder balls, may be disposed on the second pads 114 of the first package substrate 110 respectively, the first semiconductor chip 120 may be disposed on the middle region of the first package substrate 110 such that fourth pads 122 of the first semiconductor chip 120 contact the second conductive bumps 150 respectively, and then a reflow process may be performed to adhere the first semiconductor chip 120 to the first package substrate 110 via the second conductive bumps 150.

Then, fifth conductive bumps 180, such as solder balls, may be disposed on the thirds pads 116 respectively, and then adhered to the third pads 116 respectively by a reflow process.

Figure 17:
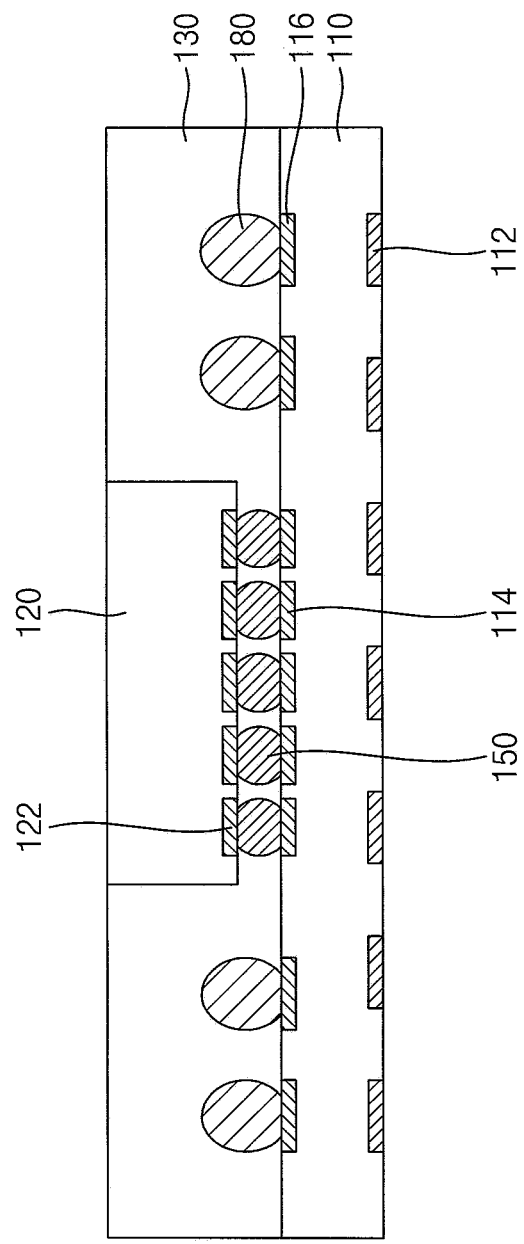

Referring to the embodiment of FIG. 17, a first molding member 130 may be formed on the first package substrate 110 to sufficiently cover the first semiconductor chip 120, the second conductive bumps 150, and the fifth conductive bumps 180, and may be planarized until an upper surface of the first semiconductor chip 120 is exposed. For example, the first molding member 130 may be formed of epoxy molding compound (EMC).

Alternatively, the first molding member 130 may be formed to partially or entirely cover a sidewall and the upper surface of the first semiconductor chip 120. That is, the upper surface of the first semiconductor chip 120 may be covered by the first molding member 130. The semiconductor package 100 including the first semiconductor chip 120 with the upper surface being covered by the first molding member 130 is illustrated in FIG. 2. Hereinafter, for the convenience of explanations, only the case that the upper surface of the first semiconductor chip 120 is exposed will be illustrated.

Figure 18:
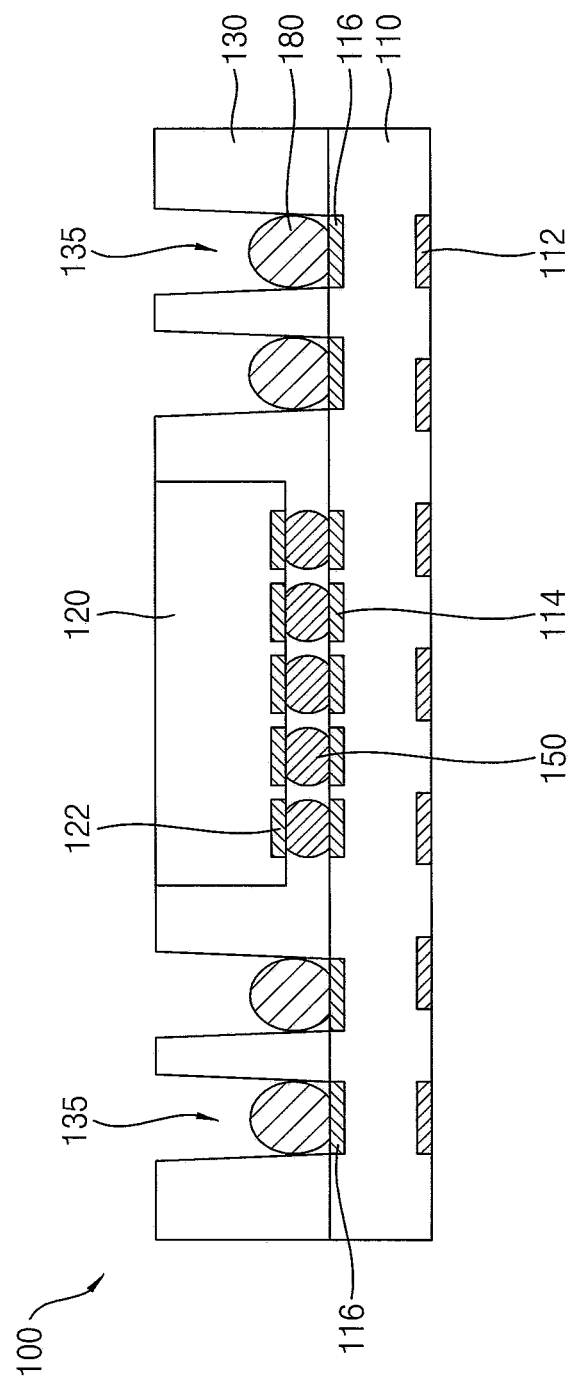

Referring to the embodiment of FIG. 18, the first molding member 130 may be partially removed to form a plurality of first openings 135 that expose the fifth conductive bumps 180 on the third pads 116, respectively.

For example, the first openings 135 may be formed using a laser drill or a mechanic drill, as examples.

Figure 19:
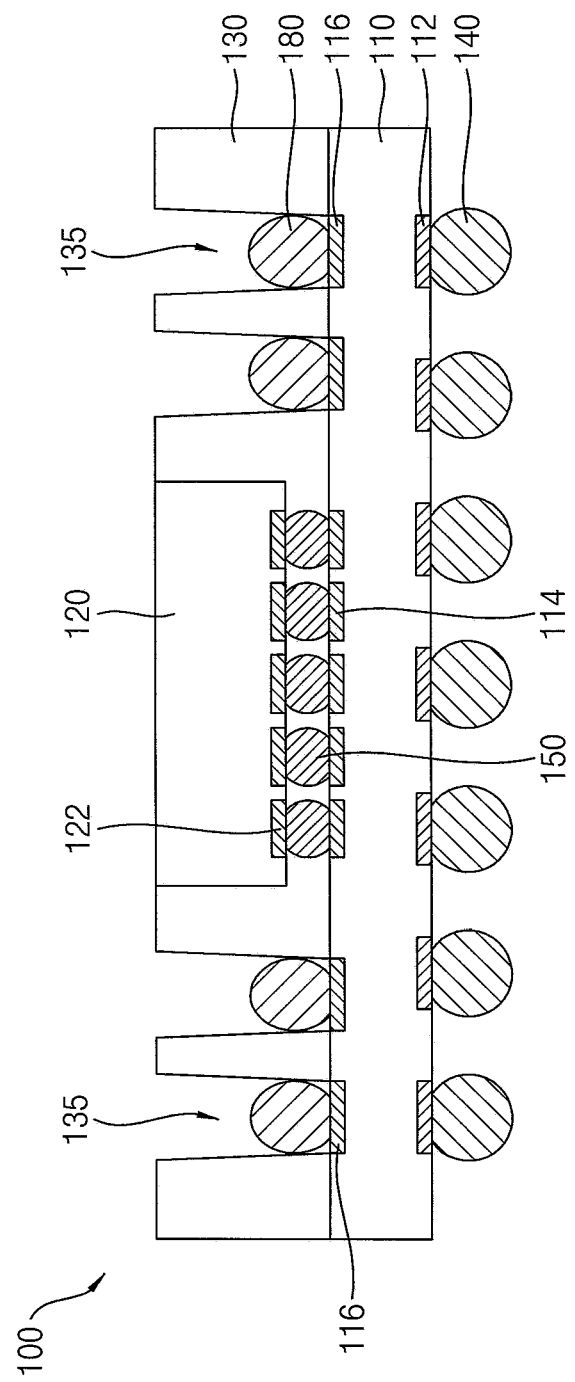

Referring to the embodiment of FIG. 19, first conductive bumps 140 may be adhered to the lower surface of the first package substrate 110, and the first package substrate 110 may be divided into a plurality of first semiconductor packages 100 by a sawing process, for example.

For example, the first conductive bumps 140, such as solder balls, may be disposed on the first pads 112 respectively, and then may be adhered to the first pads 112 respectively by a reflow process. On the other hand, a carrier substrate (not illustrated) may be adhered to the lower surface of the first package substrate 110 by a first temporary adhesive, and then, the sawing process may be performed.

Figure 20:
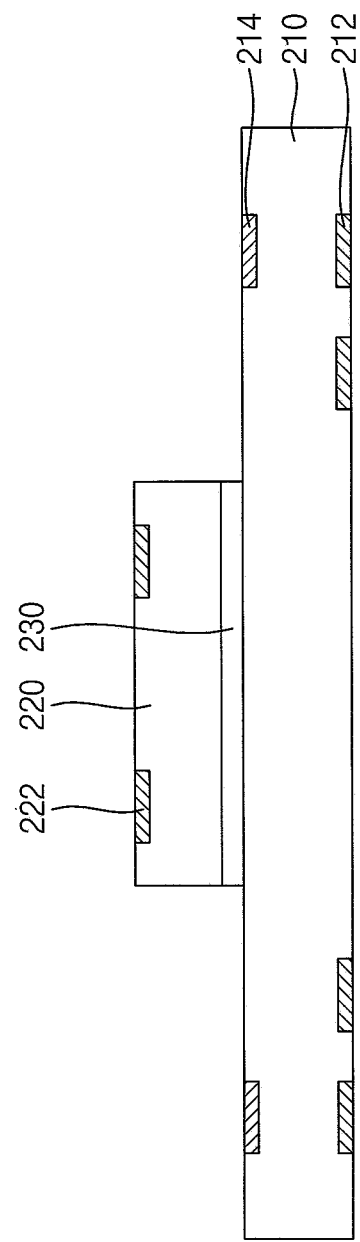

Referring to the embodiment of FIG. 20, a second semiconductor chip 220 may be mounted on the second package substrate 210.

The second package substrate 210 may be, for example, a printed circuit board (PCB), and may include fifth and sixth pads 212 and 214. Although it is not illustrated in the figure, the second package substrate 210 may further include various wirings and/or through vias electrically connected to the fifth and sixth pads 212 and 214.

A plurality of the fifth pads 212 may be arranged on a lower surface of the second package substrate 210. A plurality of the sixth pads 214 may be arranged on an upper surface of the second package substrate 210. The fifth and sixth pads 212 and 214 may include a conductive material, for example, a metal such as copper, aluminum, etc., or an alloy thereof.

The second semiconductor chip 220 may be mounted on the middle region of the second package substrate 110 via an adhesive layer 230. The second semiconductor chip 220 may include bonding pads 222 on an upper surface thereof. A plurality of the bonding pads 222 may be arranged to be exposed through the upper surface of the second semiconductor chip 220. The bonding pads 222 may include or be formed of a conductive material, for example, a metal such as copper, aluminum, etc., or an alloy thereof.

Figure 21:
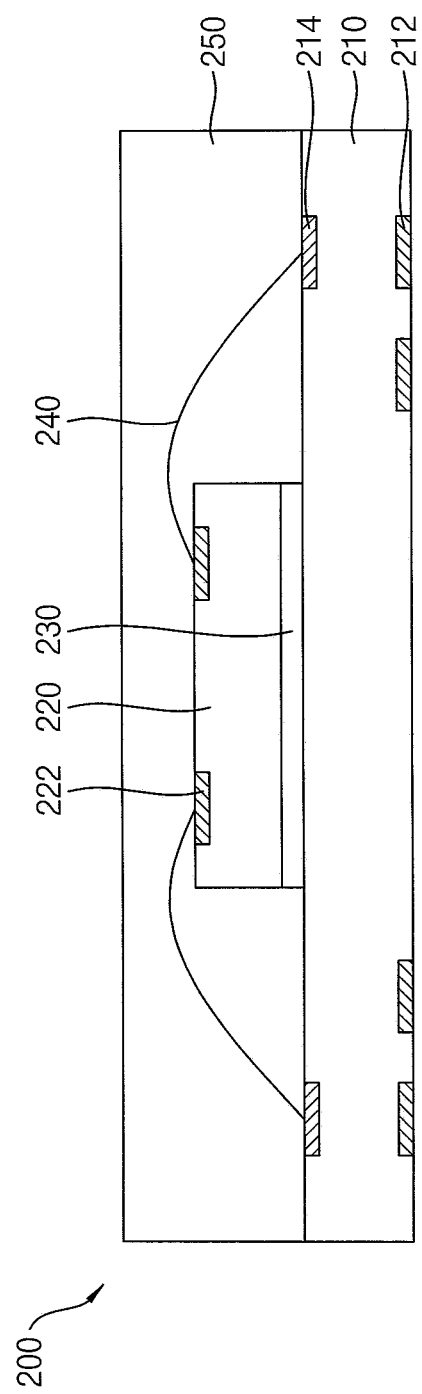

Referring to the embodiment of FIG. 21, the second semiconductor chip 220 may be electrically connected to the second package substrate 210 by conductive wires 240, and then a second molding member 250 may be formed on the second package substrate 210 to cover the second semiconductor chip 220 and the conductive wire 240.

The conductive wires 240 may connect the bonding pads 222 of the second semiconductor chip 220 and the sixth pads 214 of the second package substrate 210 respectively.

For example, the second molding member 250 may be formed of, for example, an insulating material, such as EMC.

Figure 22:
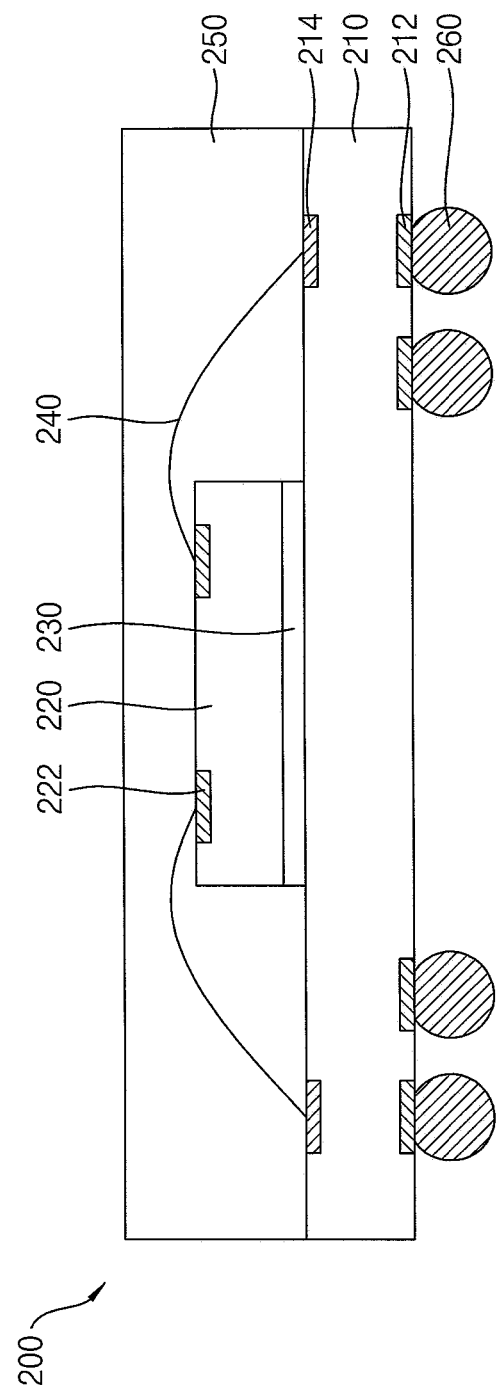

Referring to the embodiment of FIG. 22, sixth conductive bumps 260 may be adhered to the lower surface of the second package substrate 210, and the second package substrate 210 may be divided into a plurality of second semiconductor packages 200 by a sawing process, for example.

For example, the sixth conductive bumps 260, such as solder balls, may be disposed on the fifth pads 212 respectively, and then may be adhered to the fifth pads 212 respectively by a reflow process. On the other hand, a carrier substrate (not illustrated) may be adhered to the lower surface of the second package substrate 210 by a second temporary adhesive, and then, the sawing process may be performed.

Referring to the embodiments of FIGS. 23 and 24, a second opening 312 and a third opening 314 may be formed through an interposer substrate 310.

The interposer substrate 310 may include an insulating material, for example, silicon, insulating ceramic, or plastic.

A plurality of the third openings 314 may be formed in the middle region of the interposer substrate 310. For example, the third openings 314 may be arranged in a region "A" overlapping with the first semiconductor chip 120.

A plurality of the second openings 312 may be arranged around the region A. As examples, the second and third openings 312 and 314 may be formed using a laser drill or a mechanic drill.

Figure 25:
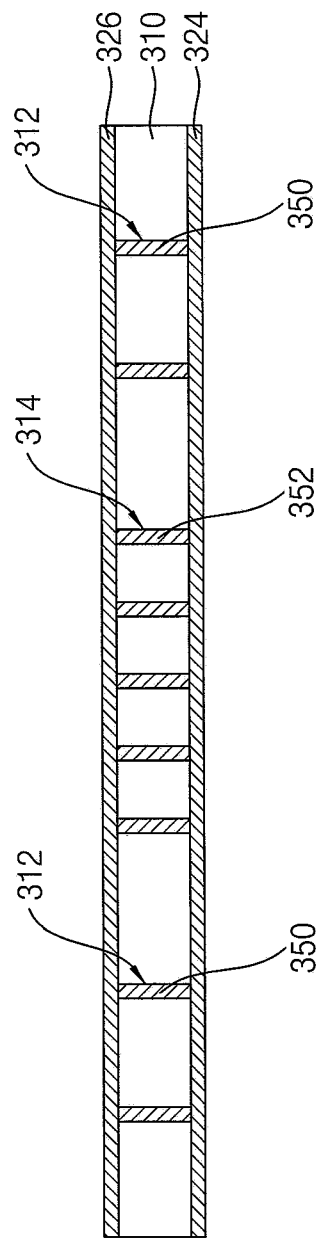

Referring to the embodiment of FIG. 25, the second and third openings 312 and 314 may be filled up with a conductive material, for example, a metal such as copper, aluminum, etc., or an alloy thereof, to form first through vias 350 and second through vias 352.

The first through via 350 may include a material the same as or different from the second through via 352. For example, the first through via 350 may include a material having excellent electrical conductivity and the second through via 352 may include a material having excellent heat conductivity.

Then, a first conductive layer 324 may be formed on a lower surface of the interposer substrate 310 and a second conductive layer 326 may be formed on an upper surface of the interposer substrate 310. The first and second conductive layers 324 and 326 may include a conductive material, for example, a metal such as copper, aluminum, etc. The first and second conductive layers 324 and 326 may be formed using an electrolytic plating process or an electroless plating process.

In example embodiments, the process of filling the second and third openings 312 and 314 may be performed together with the process of forming the first conductive layer 324 or the process of forming the second conductive layer 326.

Figure 26:
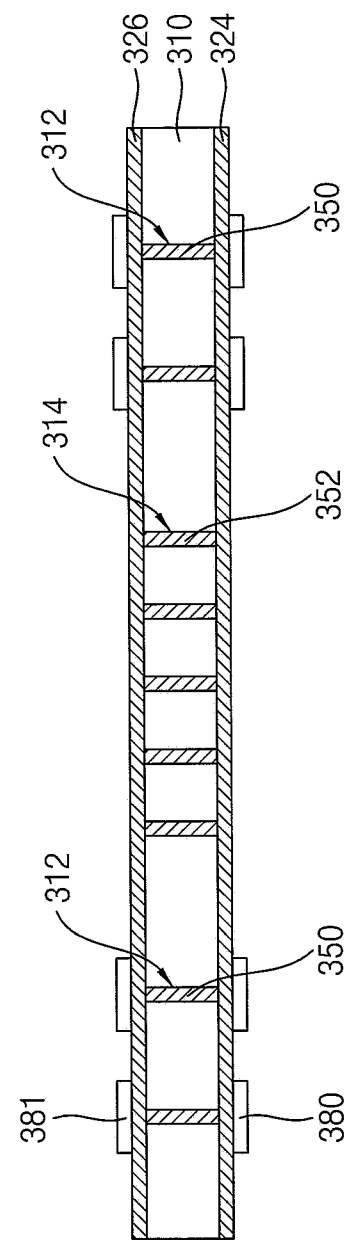

Referring to the embodiment of FIG. 26, a first mask pattern 380 may be formed on the first conductive layer 324 and a second mask pattern 381 may be formed on the second conductive layer 326.

A first mask layer and a first photoresist layer pattern may be formed sequentially on the first conductive layer 324, and exposure and development processes may be performed to form the first mask pattern 380.

The first mask layer may include carbon or silicon based spin on hard mask (SOH) material, or silicon oxynitride based hard mask material.

In example embodiments, the exposure process may be performed using KrF, ArF, EUV (extreme ultra violet), VUV (vacuum ultra violet), electron beam, X-ray, ion beam, etc.

The second mask pattern 381 may be formed using processes substantially the same as or similar to the processes of forming the first mask pattern 380. For example, a second mask layer and a second photoresist layer pattern may be formed sequentially on the second conductive layer 326, and exposure and development processes may be performed to form the first mask pattern 381.

Figure 27:
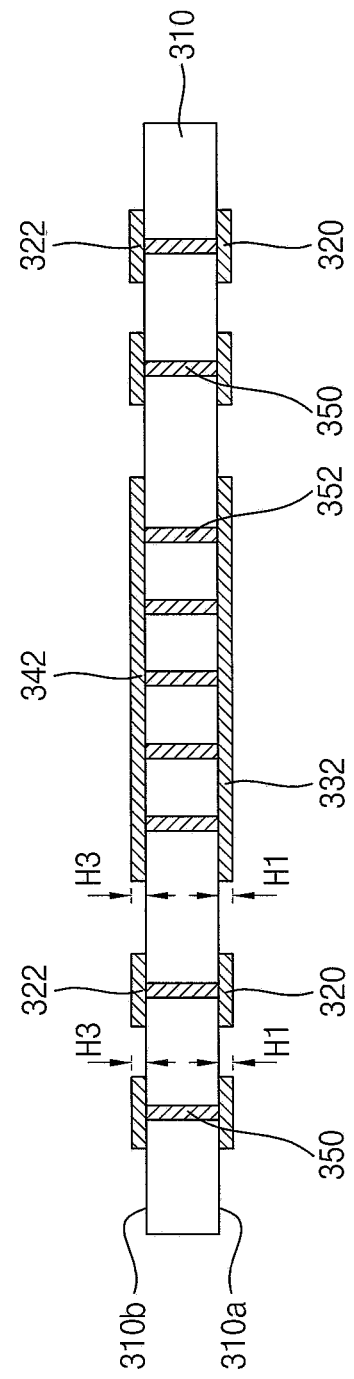

Referring to the embodiment of FIG. 27, a seventh pad 320 and a first dummy pad 322 may be formed on the lower surface of the interposer substrate 310 and an eighth pad 322 and a second dummy pad 342 may be formed on the upper surface of the interposer substrate 310.

For example, the first conductive layer 324 may be patterned using the first mask pattern 380 as an etching mask to form the seventh pad 320 and the first dummy pad 332. In this case, the seventh pad 320 and the first dummy pad 332 may have a first height or thickness H1 from a first surface 310*a* of the interposer substrate 310.

In example embodiments, as illustrated in FIGS. 4 to 6, the first thermal diffusion member 330 may be disposed corresponding to the first semiconductor chip 120 to cover the whole upper surface of the first semiconductor chip 120. For example, as illustrated in FIG. 4, the first dummy pad 332 may cover the whole upper surface of the first semiconductor chip 120 (e.g., see FIG. 4), or may cover only a portion of the upper surface of the first semiconductor chip 120 (e.g., see FIG. 5). Alternatively, a plurality of portions of the first dummy pad 332 may be formed to cover a plurality of regions of the upper surface of the first semiconductor chip 120 (e.g., see FIG. 6). A plurality of the seventh pads 320 may be arranged around the first dummy pad 332.

The eighth pad 322 and the second dummy pad 342 may be formed using processes substantially the same as or similar to the processes of forming the seventh pad 320 and the first dummy pad 332.

For example, the second conductive layer 326 may be patterned using the second mask pattern 381 as an etching mask to form the eighth pad 322 and the second dummy pad 342. The second dummy pattern 342 may have a shape substantially the same as or different from the first dummy pattern 332. In this case, the eighth pad 322 and the second dummy pad 342 may have a third height or thickness H3 from a second surface 310*b* of the interposer substrate 310.

The seventh pad 320 and the eighth pad 322 may be electrically connected to each other by the first through via 350, and the first dummy pad 332 and the second dummy pad 342 may be thermally coupled to each other by the second through via 352.

Then, the first and second mask patterns 380 and 381 may be removed from the interposer substrate 310.

Figure 28:
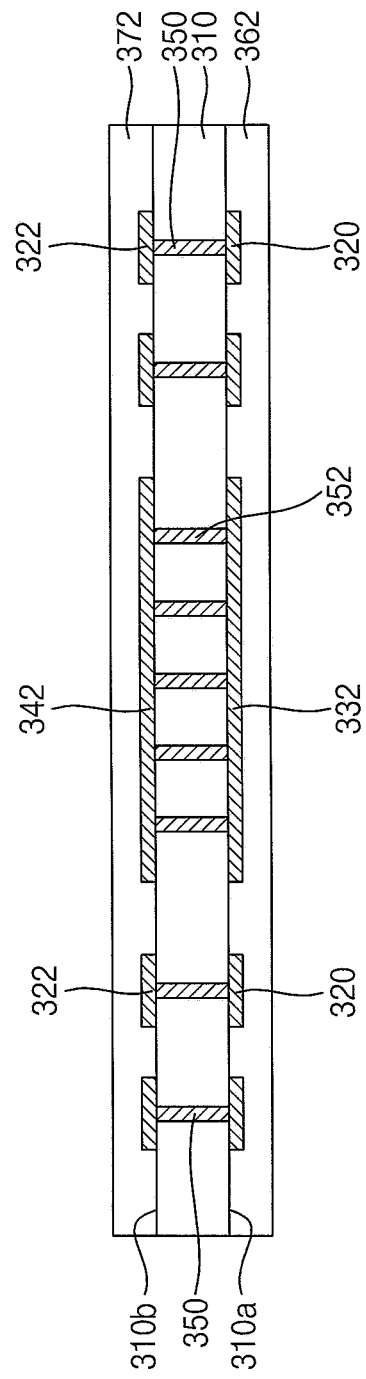

Referring to the embodiment of FIG. 28, a first preliminary protection layer 362 may be formed on the lower surface of the interposer substrate 310 and a second preliminary protection layer 364 may be formed on the upper surface of the interposer substrate 310.

For example, a photosensitive solder resist may be coated on the lower surface 310*a* of the interposer substrate 310 to cover the first dummy pad 332 and the seventh pad 320, and may be cured to form the first preliminary protection layer 362.

The second preliminary protection layer 372 may be formed on the upper surface 310*b* of the interposer substrate 310 to cover the second dummy pad 332 and the eighth pad 322 by processes substantially the same as or similar to the processes of forming the first preliminary protection layer 362.

Figure 29:
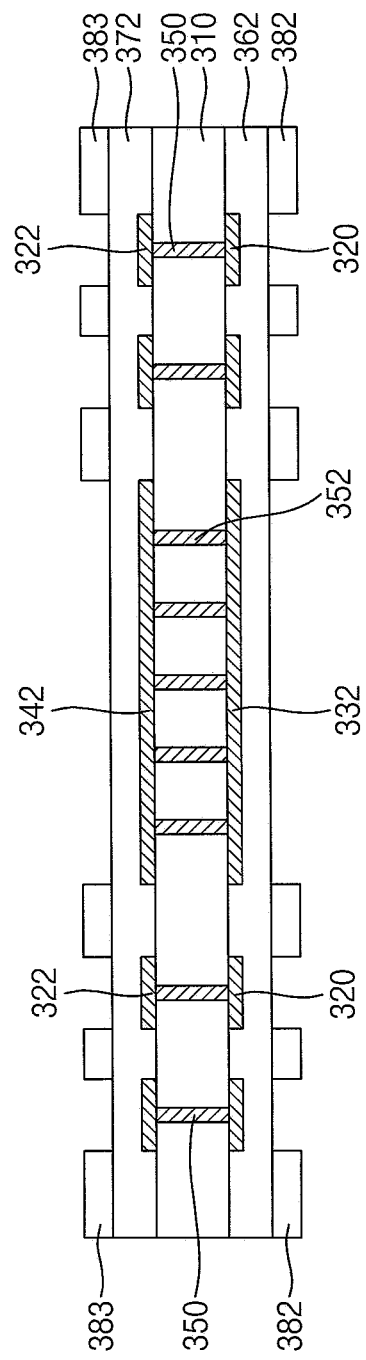

Referring to the embodiment of FIG. 29, a third mask pattern 382 may be formed on the first preliminary protection layer 362 and a fourth mask pattern 383 may be formed on the second preliminary protection layer 372.

The third and fourth mask patterns 382 and 383 may be formed by processes substantially the same as or similar to the processes of forming the first mask pattern 380. For example, a third mask layer and a third photoresist layer pattern may be formed sequentially on the first preliminary protection layer 362, and exposure and development processes may be performed to form the third mask pattern 382. A fourth mask layer and a fourth photoresist layer pattern may be formed sequentially on the second preliminary protection layer 372, and exposure and development processes may be performed to form the third mask pattern 382.

Figure 30:
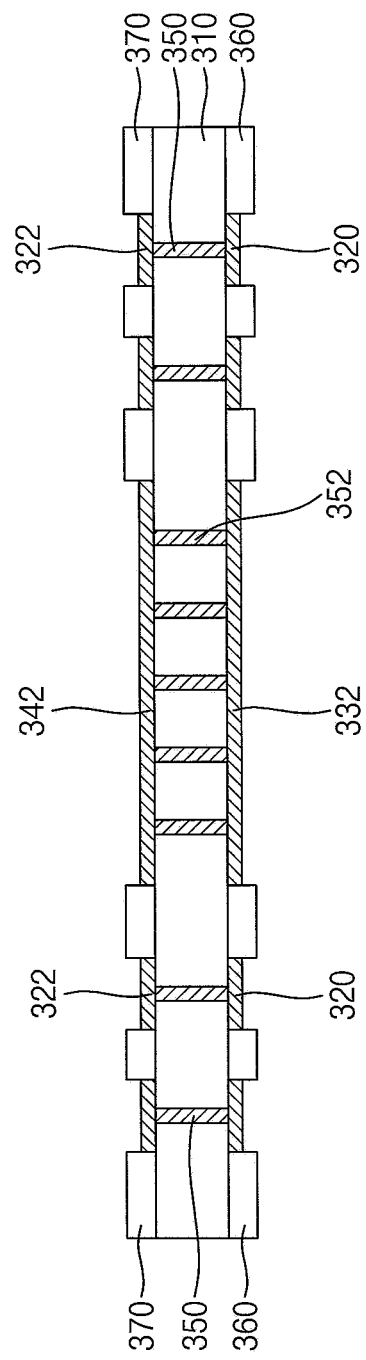

Referring to the embodiment of FIG. 30, the first and second preliminary protection layers 362 and 372 may be partially removed to form first and second protection layers 360 and 370, respectively.

For example, the first preliminary protection layer 362 may be patterned using the third mask pattern 382 as an etching mask to form the first protection layer 360. Thus, the seventh pad 320 and the first dummy pad 332 may be exposed by the first protection layer 360. The second preliminary protection layer 372 may be patterned using the fourth mask pattern 383 as an etching mask to form the second protection layer 370. Thus, the eighth pad 322 and the second dummy pad 342 may be exposed by the second protection layer 370.

Then, the third and fourth mask patterns 382 and 383 may be removed from the interposer substrate 310.

Figure 31:
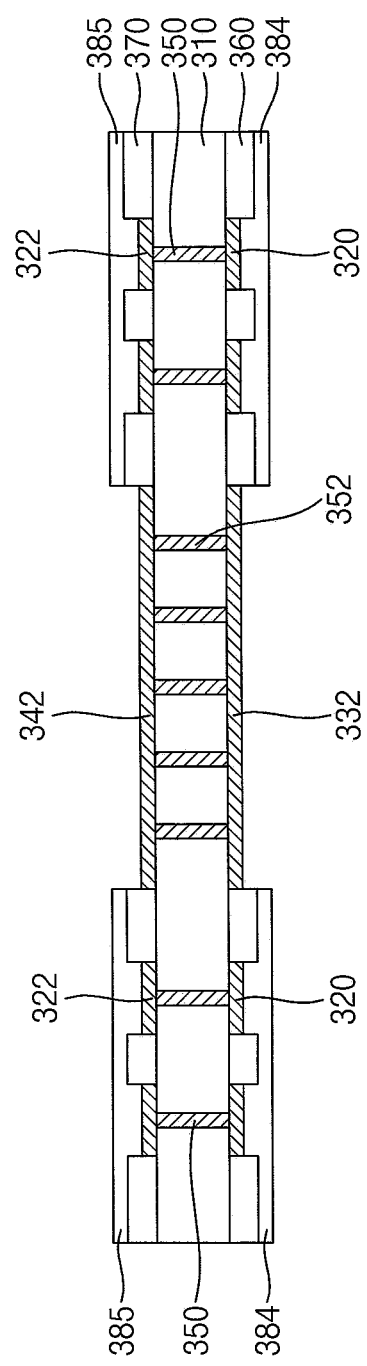

Referring to the embodiment of FIG. 31, a fifth mask pattern 384 may be formed on the lower surface of the interposer substrate 310 to cover the seventh pad 320 and the first protection layer 360, and a sixth mask pattern 385 may be formed on the upper surface of the interposer substrate 310 to cover the eighth pad 322 and the second protection layer 370.

The fifth and sixth mask patterns 384 and 385 may be formed by processes substantially the same as or similar to the processes of forming the first mask pattern 380. For example, a fifth mask layer and a fifth photoresist layer pattern may be formed sequentially on the lower surface of the interposer substrate 310, and exposure and development processes may be performed to form the fifth mask pattern 384. A sixth mask layer and a sixth photoresist layer pattern may be formed sequentially on the upper surface of the interposer substrate 310, and exposure and development processes may be performed to form the sixth mask pattern 385. Thus, while the seventh pad 320 and the eighth pad 322 may not be exposed, the first dummy pad 332 and the second dummy pad 342 may be exposed by the fifth and sixth mask patterns 384 and 385, respectively.

Referring to FIG. 32 and again to FIG. 3, a first thermal diffusion member 330 may be formed on the lower surface of the interposer substrate 310 and a second thermal diffusion member 340 may be formed on the upper surface of the interposer substrate 310.

A third conductive layer (not illustrated) may be formed on the first dummy pad 332 and a fourth conductive layer (not illustrated) may be formed on the second dummy pad 342. The third and fourth conductive layers may be formed by an electrolytic plating process or an electroless plating process.

The third and fourth conductive layers may be deposited to have sufficient thicknesses and patterned to form a first heat dissipating pad 334 and a second heat dissipating pad 344 respectively. The first dummy pad 332 and the first heat dissipating pad 334 may form the first thermal diffusion member 330, and the second dummy pad 342 and the second heat dissipating pad 344 may form the second thermal diffusion member 340.

In example embodiments, the first thermal diffusion member 330 may have a second height or thickness H2 that is greater than the first height or thickness H1 of the seventh pad 320 from the first surface 310a of the interposer substrate 310, and the second thermal diffusion member 340 may have a fourth height or thickness H4 that is greater than the third height or thickness H3 of the eighth pad 322 from the second surface 310b of the interposer substrate 310.

In example embodiments, the first and second heat dissipating pads 334 and 344 may include a material substantially the same as the first and second dummy pads 332 and 342. For example, the first and second heat dissipating pads may include a metal, such as copper, aluminum, etc., or an alloy thereof, graphene, graphite, etc. In this case, since the first dummy pad 332 and the first heat dissipating pad 334 include the same material, interfacial characteristics may be improved. For example, heat transfer properties between the first dummy pad 332 and the first heat dissipating pad 334 may be improved. Thus, heat from the first semiconductor chip 120 and the second semiconductor chip 220 may be effectively removed, and warpage due to the heat in the stack package including the first and second semiconductor chips 120 and 220 may be prevented.

Alternatively, the first and second heat dissipating pads 334 and 344 may include a material different from the first and second dummy pads 332 and 342. For example, the first and second dummy pads 332 and 342 may include a metal, and the first and second heat dissipating pads 334 and 344 may include graphene, graphite, etc.

Then, the fifth and sixth mask patterns 384 and 385 may be removed from the interposer substrate 310.

Figure 32:
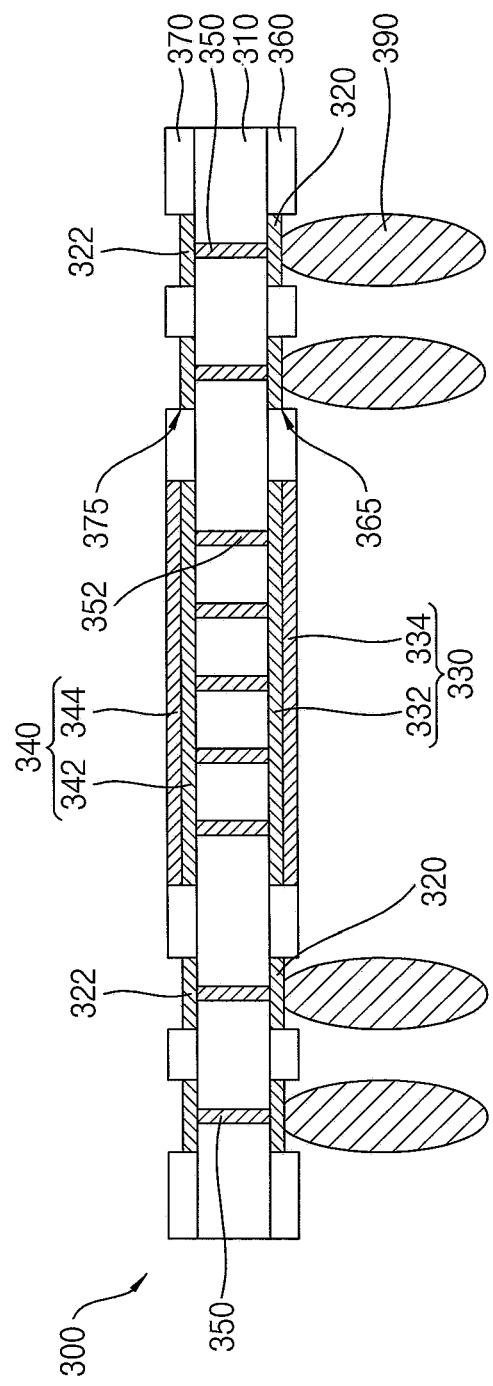

Again referring to the embodiment of FIG. 32, sixth conductive bumps 390 may be disposed on the seventh pads 320 respectively, to form an interposer 300.

Figure 33:
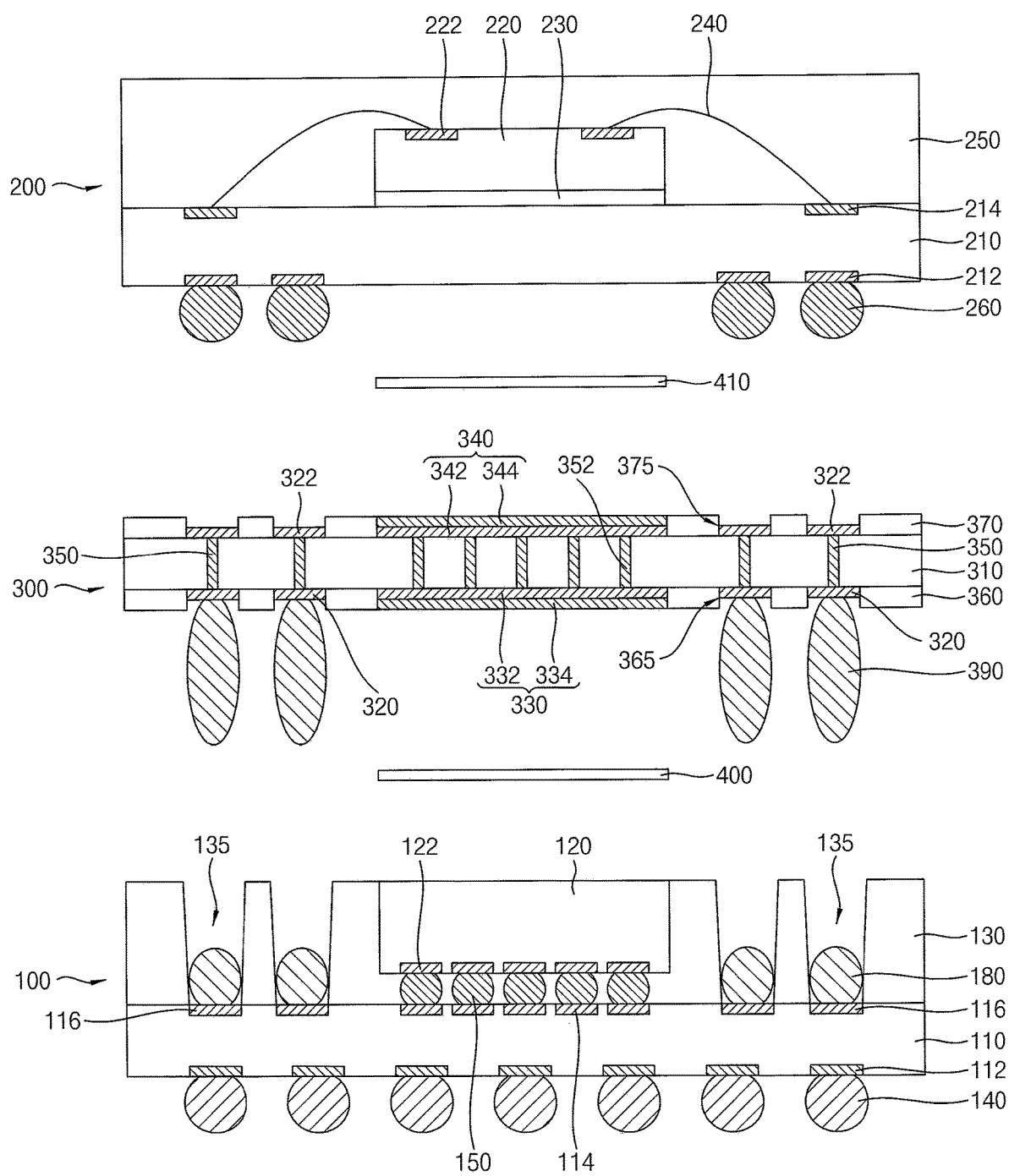

FIG. 33 is a partially exploded view of an embodiment of a stack package in accordance with aspects of the inventive concept. Referring to the embodiments of FIGS. 1 and 33, the first semiconductor package 100, the interposer 300, and the second semiconductor package 200 may be stacked sequentially on one another to manufacture the stack package.

In particular, the interposer 300 may be disposed on the first semiconductor package 100 such that the sixth conductive bumps 390 on the lower surface of the interposer substrate 310 may be in contact with the fifth conductive bumps 180 on the first package substrate 110 respectively and may be combined by a reflow process. Thus, a portion of the fifth conductive bump 180 may be combined with a portion of the sixth conductive bump 390 to form a third conductive bump 380.

Further, the second semiconductor package 200 may be disposed on the interposer such that the fourth conductive bumps 260 on the lower surface of the second package substrate 210 may be in contact with the eighth pads 322 on the upper surface of the interposer substrate 300, respectively, and may be combined by a reflow process.

In example embodiments, a first thermal interface material layer 400 may be interposed between the first semiconductor package 100 and the interposer 300, and a second thermal interface material layer 410 may be interposed between the interposer 300 and the second semiconductor package 200. Thus, the first heat dissipating pad 334 may be thermally coupled with the first semiconductor chip 120 via the first thermal interface material layer 400, and the second heat dissipating pad 344 may be thermally coupled with the second package substrate 210 via the second thermal interface material layer 410. The first and second thermal interface material layers 400 and 410 may include a material having a low contact thermal resistance, for example, thermal grease, thermal epoxy, etc.

Alternatively, the stack package may include any one of the first and second thermal interface material layers 400 and 410 or no thermal interface material layer. For example, the stack package may include only a second thermal interface material layer 410 between the interposer 300 and the second semiconductor package 200. In this case, the first thermal diffusion member 330 may be in contact with the first semiconductor package 100 or may be spaced apart from the first semiconductor package 100.

Then, the first carrier substrate and the first temporary adhesive may be removed from the first package substrate 110, and the stack package may be mounted on a main board (not illustrated) by the first conductive bumps 140.

The foregoing is illustrative of example embodiments and is not to be construed as limiting of the inventive concept. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method of manufacturing a stack package, comprising:
    forming a first semiconductor chip on a first package substrate;
    disposing first conductive bumps on first pads of the first package substrate, the first pads being arranged around the first semiconductor chip;
    forming a first molding member on the first package substrate to cover a sidewall of the first semiconductor chip and expose an upper surface of the first semiconductor chip;
    partially removing the first molding member to form first openings that expose the first conductive bumps respectively;
    forming a second semiconductor chip on a second package substrate;
    forming a plurality of signal pads and first and second thermal diffusion members on a lower surface and an upper surface of an interposer substrate respectively, the signal pads having a first height and the first and second thermal diffusion members having a second height greater than the first height;
    stacking the interposer substrate on the first molding member such that second conductive bumps on the signal pads on the lower surface of the interposer substrate are in contact with the first conductive bumps respectively and the first thermal diffusion member is in contact with the upper surface of the first semiconductor chip; and stacking the second package substrate on the interposer substrate such that the second thermal diffusion member is in contact with a lower surface of the second package substrate and third conductive bumps on the lower surface of the second package substrate are in contact with the signal pads on the upper surface of the interposer substrate respectively.

2. The method of claim 1, wherein forming the first and second thermal diffusion members comprises:
   forming a dummy pad on the lower surface and the upper surface of the interpose substrate, the dummy pad having a third height substantially the same as the first height; and
   forming a heat dissipating pad on the dummy pad.

3. The method of claim 2, wherein forming the dummy pad comprises:
   forming a first conductive layer on the lower surface and the upper surface of the interposer substrate; and
   partially removing the first conductive layer to form the dummy pad and a plurality of the signal pads.

4. The method of claim 3, wherein forming the heat dissipating pad comprises forming a second conductive layer on the dummy pad.

5. The method of claim 4, wherein forming the first and second conductive layers comprises performing an electrolytic plating process or an electroless plating process.

6. The method of claim 4, wherein the first and second conductive layers comprises a same material.

7. The method of claim 1, further comprising forming at least one through via penetrating through the interposer substrate and connecting the first thermal diffusion member and the second thermal diffusion member to each other.

8. The method of claim 1, further comprising forming a protection layer on the lower surface and the upper surface of the interposer substrate to expose the signal pads and the thermal diffusion member.

9. The method of claim 1, wherein the first thermal diffusion member comprises a plurality of thermal diffusion portions covering portions of the upper surface of the first semiconductor chip and the second thermal diffusion member comprises a plurality of thermal diffusion portions covering portions of the lower surface of the second package substrate.

10. The method of claim 1, wherein stacking the first package substrate on the interposer substrate or stacking the second package substrate on the interposer substrate comprises interposing at least one thermal interface material layer interposed therebetween, the thermal interface material layer contacting the upper surface of the first semiconductor chip or the lower surface of the second package substrate.

11. A method of manufacturing a stack package, comprising:
   forming a first semiconductor chip on a first package substrate;
   forming a first molding member on the first package substrate to cover a sidewall of the first semiconductor chip and expose an upper surface of the first semiconductor chip;
   forming a second semiconductor chip on a second package substrate;
   forming a first conductive layer on a lower surface of an interposer substrate;
   partially removing the first conductive layer to form a first preliminary thermal diffusion member and a plurality of first signal pads;
   forming a second conductive layer on the first preliminary thermal diffusion member to form a first thermal diffusion member;
   forming a third conductive layer on an upper surface of the interposer substrate;
   partially removing the third conductive layer to form a second preliminary thermal diffusion member and a plurality of second signal pads;
   forming a fourth conductive layer on the second preliminary thermal diffusion member to form a second thermal diffusion member;
   stacking the interposer substrate on the first molding member such that the first thermal diffusion member is in contact with the upper surface of the first semiconductor chip; and
   stacking the second package substrate on the interposer substrate such that the second thermal diffusion member is in contact with a lower surface of the second package substrate.

12. The method of claim 11, wherein the first thermal diffusion member has a thickness greater than a thickness of the first signal pad, and the second thermal diffusion member has a thickness greater than a thickness of the second signal pad.

13. The method of claim 11, further comprising forming at least one through via penetrating through the interposer substrate and connecting the first thermal diffusion member and the second thermal diffusion member to each other.

14. The method of claim 11, further comprising:
   forming a first protection layer on the lower surface of the interposer substrate to expose the first signal pads and the first thermal diffusion member and the upper surface of the interposer substrate to expose the signal pads and the first thermal diffusion member; and
   forming a second protection layer on the upper surface of the interposer substrate to expose the second signal pads and the second thermal diffusion member.

15. A method of manufacturing a stack package, comprising:
   forming a first semiconductor package comprising a first semiconductor chip on a first package substrate and a first molding member on the first package substrate to cover a sidewall of the first semiconductor chip and expose an upper surface of the first semiconductor chip;
   forming an interposer on the first molding member of the first semiconductor package; and
   forming a second semiconductor package comprising a second semiconductor chip on a second package substrate, on the interposer,
   wherein forming the interposer includes:
      forming a plurality of signal pads and first and second thermal diffusion members on a lower surface and an upper surface of an interposer substrate respectively, the signal pads having a first height and the first and second thermal diffusion members having a second height greater than the first height,
      such that the first thermal diffusion member is in contact with the upper surface of the first semiconductor chip and the second thermal diffusion member is in contact with a lower surface of the second package substrate.

16. The method of claim 15, further comprising:
   forming a dummy pad on at least one of the lower surface or the upper surface of the interpose substrate, the dummy pad having a third height substantially the same as the first height, wherein forming the dummy pad comprises:

forming a first conductive layer on the lower surface or the upper surface of the interposer substrate; and
partially removing the first conductive layer to form the dummy pad and a plurality of the signal pads; and
forming a heat dissipating pad on the dummy pad,
wherein forming the heat dissipating pad comprises forming a second conductive layer on the dummy pad.

* * * * *